United States Patent
Sakamoto et al.

(10) Patent No.: US 6,495,805 B2
(45) Date of Patent: Dec. 17, 2002

(54) METHOD OF DETERMINING SET TEMPERATURE TRAJECTORY FOR HEAT TREATMENT SYSTEM

(75) Inventors: Koichi Sakamoto, Shiroyama-Machi (JP); Wenling Wang, Shiroyama-Machi (JP); Fujio Suzuki, Shiroyama-Machi (JP); Moyuru Yasuhara, Tokyo-To (JP); Keisuke Suzuki, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/933,671

(22) Filed: Aug. 22, 2001

(65) Prior Publication Data

US 2002/0001788 A1 Jan. 3, 2002

(30) Foreign Application Priority Data

Aug. 24, 2000 (JP) ........................................ 2000-254479
Jun. 11, 2001 (JP) ........................................ 2001-176216

(51) Int. Cl.⁷ ................................................ H05B 3/02
(52) U.S. Cl. ...................... 219/483; 219/494; 219/501; 219/510; 392/416; 118/724; 118/725
(58) Field of Search ................................ 219/390, 405, 219/411, 476, 480, 481, 490, 494, 501, 510, 483; 118/724, 725, 50.1; 392/416, 418

(56) References Cited

U.S. PATENT DOCUMENTS

| | | | | |
|---|---|---|---|---|
| 5,314,538 A | * | 5/1994 | Maeda et al. ................ 118/715 |
| 5,443,646 A | * | 8/1995 | Yamada et al. ............. 118/722 |
| 5,593,608 A | * | 1/1997 | Suzuki ....................... 219/492 |
| 5,616,264 A | * | 4/1997 | Nishi et al. .................. 219/494 |
| 5,622,639 A | * | 4/1997 | Kitayama et al. ........... 219/390 |
| 6,065,869 A | * | 5/2000 | Lin et al. ..................... 374/183 |
| 6,167,360 A | | 12/2000 | Erickson et al. ................ 703/6 |
| 6,229,116 B1 | * | 5/2001 | Shirakawa et al. ......... 219/390 |
| 6,289,508 B1 | | 9/2001 | Erickson et al. ............... 717/9 |
| 6,324,341 B1 | * | 11/2001 | Riley et al. .................. 392/416 |

* cited by examiner

Primary Examiner—Teresa Walberg
Assistant Examiner—Shawntina T Fuqua
(74) Attorney, Agent, or Firm—Smith, Gambrell & Russell, LLP

(57) ABSTRACT

This invention is a method of determining set temperature trajectories for a heat treatment system that conducts a first heat treatment process and a second heat treatment process to an object to be processed. The method comprises the steps of: conducting the first heat treatment process to a first test object to be processed, by using a temporary first set temperature trajectory; measuring a result of the first heat treatment process produced on the first test object to be processed; and determining a first set temperature trajectory for the first heat treatment process by correcting the temporary first set temperature trajectory on the basis of the measured result of the first heat treatment process. The method also comprises the steps of: conducting the second heat treatment process to a second test object to be processed to which the first heat treatment process has been conducted by using the determined first set temperature trajectory, by using a temporary second set temperature trajectory; measuring a result of the first heat treatment process and the second heat treatment process produced on the second test object to be processed; and determining a second set temperature trajectory for the second heat treatment process by correcting the temporary second set temperature trajectory on the basis of the measured result of the first heat treatment process and the second heat treatment process.

20 Claims, 12 Drawing Sheets

| | EMBODIMENT | COMPARATIVE EXAMPLE |
|---|---|---|
| PROCESS | GATE OXIDE FILM FORMING PROCESS AND GATE OXIDE FILM MODIFYING PROCESS | THE SAME |
| FIRST HEAT TREATMENT | GATE OXIDE FILM FORMATION BY THERMAL OXIDATION | THE SAME |
| SECOND HEAT TREATMENT | GATE OXIDE FILM MODIFICATION USING NO | THE SAME |
| OBJECT OF OPTIMIZATION | (1) SET TEMPERATURES FOR THE ZONES OF THE WAFER BOAT FOR GATE OXIDE FILM FORMATION<br>(2) SET TEMPERATURES FOR THE ZONES OF THE WAFER BOAT FOR GATE OXIDE FILM MODIFICATION | SET TEMPERATURES FOR THE ZONES OF THE WAFER BOAT FOR GATE OXIDE FILM FORMATION AND GATE OXIDE FILM MODIFICATION |
| DESIRED THICKNESS | (1) GATE OXIDE FILM : 1.65 nm<br>(2) MODIFIED GATE OXIDE FILM : 1.8 nm | 1.5 nm |
| SET TEMPERATURE | (1) : 805°C, 801°C, 799°C, 796°C<br>(UPPER TO LOWER ZONE)<br>(2) : 848°C, 850°C, 851°C, 852°C<br>(UPPER TO LOWER ZONE) | 855°C, 855°C, 840°C, 830°C<br>(UPPER TO LOWER ZONE) |
| THICKNESS · INTER-WAFER MEAN THICKNESS | (1) 1.667 nm<br>(2) 1.762 nm | 1.559 nm |
| · RANGE OF INTER-WAFER THICKNESS DIFFERENCE | (1) ±0.47%<br>(2) ±0.64% | ±0.65% |
| PEAK NITROGEN CONTENT (RANGE OF INTER-WAFER THICKNESS DIFFERENCE) | 1.05~1.15 atoms%<br>(±4.5%) | 0.91~1.26 atoms%<br>(±16%) |

FIG.15

METHOD OF DETERMINING SET TEMPERATURE TRAJECTORY FOR HEAT TREATMENT SYSTEM

BACKGROUND OF THE INVENTION

1. Field of the Invention

The present invention relates to a method of determining a set temperature trajectory for a heat treatment system for conducting a heat-treating process, such as a film deposition process, to an object to be processed. More particularly, the present invention relates to a method of determining a set temperature trajectory for a heat treatment system to enable the heat treatment system to form a film accurately.

2. Description of the Related Art

A heat treatment step for heat-treating a wafer to form a specific film thereon is one of essential processes for fabricating a semiconductor device or the like. The heat treatment step is carried out by a heat treatment system in a high-temperature environment of a comparatively high temperature in the range of about 750 to 900° C. Chemical vapor deposition processes (CVD processes) and oxidation/diffusion processes are such heat treatment processes.

Generally, the heat treatment system is provided with a wafer holding device (called a wafer boat) for holding a plurality of wafers in a vertically layered (tier-like) arrangement, a tubular reaction tube for containing the wafer holding device therein, a plurality of heaters formed so as to surround the side wall of the reaction tube and arranged at axial intervals, a gas supply line for carrying reactant gases to the reaction tube, and an exhaust line through which gases are discharged from the reaction tube.

Power is supplied at a predetermined rate to the heaters to maintain the wafers at a temperature suitable for film formation. It is practically impossible to measure the temperatures of the wafers during a film forming process. Therefore, usually, the measured temperature of a part other than the wafers is used for controlling the process temperature.

The control of the respective outputs of the heaters is essential to accurately achieving a heat treatment process, such as a process for depositing a film on wafers. A film deposition process will be described as an example of such a heat treatment process.

The thickness and quality of a film deposited on a wafer deviate from set values when the temperature of the wafer differs even slightly from a set wafer temperature. For example, in a certain film deposition process, a temperature difference of 1° C. of the temperature of a wafer from a set wafer temperature causes a thickness difference of 0.1 nm of the thickness of a film from a set thickness. If the thickness of a film is in the range of several nanometers to several tens nanometers, the temperature of the wafer must be controlled in an accuracy of several degrees centigrade when the set temperature of the wafer is several hundreds degrees centigrade.

The distribution of the concentration of the reactant gas in the reaction tube is not uniform when the reactant gas flows in a constant flow from the gas supply side toward the gas discharge side of the reaction tube. If the temperatures of different zones in the reaction tube are controlled in the same way while the distribution of the concentration of the reactant gas in the reaction tube is not uniform, films respectively having different thicknesses are deposited on different wafers, respectively. Therefore, different set temperatures are set for the plurality of heaters arranged in the direction of arrangement of the plurality of wafers, respectively, and the respective temperatures of the plurality of heaters are controlled individually.

Optimum set temperatures must be determined for zones in the reaction tube respectively corresponding to the plurality of heaters through the repetition of correction of forming a film of a thickness in an allowable thickness range, in order to deposit films having accurate and uniform thicknesses on the wafers in the reaction tube.

An optimum set temperature can be determined by, for example, a method including the steps of placing a plurality of test wafers in the reaction tube, depositing films on the wafers at a set temperature, measuring the thicknesses of the deposited films by means of a measurement instrument, adjusting a set temperature condition in the reaction tube corresponding to the outputs of the plurality of heaters on the basis of the differences of the measured thicknesses from a desired thickness, and depositing films on test wafers under the adjusted set temperature condition. These steps are repeated until the differences of the measured thicknesses of the films from the desired thickness are reduced below a predetermined level. The set temperature condition thus determined is used as a set temperature condition in the reaction tube corresponding to the outputs of the plurality of heaters.

In some cases, films of different types are deposited in layers by film deposition processes when fabricating a semiconductor device. In such a case, optimum set temperature condition in the reaction tube corresponding to the outputs of the plurality of heaters is determined for each of the film deposition processes.

Suppose, for example, that a first film is deposited on a wafer and then a second film is deposited on the first film. An optimum set temperature condition in the reaction tube corresponding to the outputs of the plurality of heaters is determined by the aforesaid method for a first film deposition process for forming the first film. Then, an optimum set temperature condition in the reaction tube corresponding to the outputs of the plurality of heaters for a second film deposition process for forming the second film is determined by the aforesaid method using the wafers on which the first films are deposited under the optimum temperature condition as determined above. Thus, the optimum set temperature conditions are determined individually for the films to be deposited on the wafers.

However, in some cases, the semiconductor device fabricating process needs to continuously form the first film and the second film. When forming the first film and the second film continuously, the first film is deposited on wafers loaded to a heat treatment system, and then the second film is deposited on the first film without unloading the wafers from the heat treatment system after the first film has been deposited.

When the first film and the second film are thus formed continuously, only data on the result of film deposition on the wafer on which both the first and the second film are formed can be measured by a measuring instrument, and hence the foregoing method that determines optimum set temperature conditions individually for the first and the second film cannot be used.

There are two different cases of measuring data on the result of the deposition of the first and the second film. In a first case, such as a case where both the first and the second film are nitride films, the respective thicknesses of the first film and the second film cannot be individually measured and only the sum of the respective thicknesses of the first and the second film can be measured. In a second case, such as a case where the first film is an oxide film and the second film is a nitride film, the respective thicknesses of the first and the second film can be individually measured.

In the first case, an optimum set temperature condition can be determined for the film deposition process for depositing either the first or the second film. In this case, the sum of the respective thicknesses of the first and the second film can be managed, but the respective thicknesses of the first and the second film cannot be individually managed. In addition, optimum set temperature conditions may be determined for the film deposition processes respectively for depositing the first and the second film by properly dividing data on the result of film deposition. However, practically, it is unknown whether the division (assignment) is proper. Consequently, such a film thickness management is unable to achieve the film thickness management for the individual films.

In the second case, the optimum set temperature conditions for the film forming processes for forming the first and the second film must be determined in proper order. For example, if an optimum set temperature for the film deposition process for depositing the second film is determined after forming the first and the second film, and then an optimum set temperature condition for the film deposition process for depositing the first film is determined, it is possible that the determination of the optimum set temperature condition for the film deposition process for depositing the first film affect the optimum set temperature condition for the process for depositing the second film. Thus, the optimum set temperature condition for the film deposition process for depositing the second film must be readjusted. In this case, efficient determination of the optimum set temperature conditions is difficult.

Although the film deposition process has been described as an example of the heat treatment process, the foregoing problems reside generally in heat treatment processes which are carried out by heat treatment systems.

The present invention has been made in view of such problems and it is therefore an object of the present invention to provide a method of determining a set temperature condition for a heat treatment system for carrying out a heat treatment process, such as a film deposition process for depositing a film on an object to be processed, capable of determining optimum set temperature conditions respectively for a plurality of heat treatment processes to be continuously carried out in a reaction tube.

SUMMARY OF THE INVENTION

The invention is a method of determining set temperature trajectories for a heat treatment system that continuously conducts a first heat treatment process and a second heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the first heat treatment process and the second heat treatment process conducted to the second test object to be processed; and determining a second set temperature trajectory for the second heat treatment process by correcting the temporary second set temperature trajectory on the basis of the measured result of the first heat treatment process and the second heat treatment process.

According to the above feature, the temporary second set temperature trajectory is corrected on the basis of the measured result of the first heat treatment process and the second heat treatment process. The first set temperature trajectory for the first heat treatment process has already been corrected before this time point and, consequently, the second set temperature trajectory for the second heat treatment process is optimized.

Preferably, the first set temperature trajectory is fixed, and the second set temperature trajectory is fixed.

In this case, difference between the objects processed simultaneously by the heat treatment system in the result of the heat treatment process, such as difference in the thickness of the films, can be reduced. The mean thickness of films formed on objects to be processed is dependent on the process temperature.

Alternatively, the first set temperature trajectory is variable, and the second set temperature trajectory is variable.

In the case, difference between parts of each object in the result of the heat treatment process, such as the thickness of the film, can be reduced in addition to the reduction of difference between the objects processed simultaneously by the heat treatment system in the result of the heat treatment process, such as difference in the thickness of the films. A proper temperature gradient can be created between a peripheral part and a central part of an object to be processed by changing the set temperature during the heat treatment process by utilizing the rate of thermal conduction in the object. Thus, the difference in the film deposition condition, such as the concentration of the source gas, between the peripheral part and the central part of the object to be processed can be offset.

In addition, preferably, the heat treatment system is divided into a plurality of zones capable of being individually heated; first set temperature trajectories are determined for the zones of the heat treatment system, respectively; the first set temperature trajectories for the zones are different from each other; second set temperature trajectories are determined for the zones of the heat treatment system, respectively; and the second set temperature trajectories for the zones are different from each other.

Thus, the method is able to effectively deal with a case where different heat treatment conditions need to be set in the direction of arrangement of the tier-like objects to be processed.

In addition, preferably, the first heat treatment process is a gate-oxide-film forming process by using thermal oxidation, and the second heat treatment process is a nitriding process for nitriding the gate-oxide-film.

Alternatively, the invention is a method of determining set temperature trajectories for a heat treatment system that continuously conducts a first heat treatment process, a second heat treatment process and a third heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the first heat treatment process and the second heat treatment process conducted to the second test object to be processed; determining a second set temperature trajectory for the second heat treatment process by correcting the temporary second set temperature trajectory on the basis of the measured result of the first heat treatment process and the second heat treatment process; conducting the third heat treatment process to a third test object to be processed to which the first heat treatment process has been conducted by using the determined first set temperature trajectory and to which the second heat treatment process has been conducted by using the determined second set temperature trajectory, by using a temporary third set temperature trajectory; measuring a result of the first heat treatment process, the second heat treatment process and the third heat treatment process conducted to the third test object to be processed; and determining a third set temperature trajectory for the third heat treatment process by correcting the temporary third set temperature trajectory on the basis of the measured result of the first heat treatment process, the second heat treatment process and the third heat treatment process.

In the case, based on the result of the first heat treatment process, set temperature condition in a reaction tube for the first heat treatment process can be optimized, and based on the result of the first and the second heat treatment process by using the set temperature condition, set temperature condition in the reaction tube for the second heat treatment process can be optimized. And then, based on the result of the first, the second and the third heat treatment process by using the set temperature condition, set temperature condition in the reaction tube for the third heat treatment process can be optimized. Thus, the set temperature conditions for the first, the second and the third heat treatment processes can be managed. Set temperature conditions for four or more heat treatment processes can be optimized in a similar fashion.

Preferably, the first set temperature trajectory is fixed, the second set temperature trajectory is fixed, and the third set temperature trajectory is fixed.

Alternatively, the first set temperature trajectory is variable, the second set temperature trajectory is variable, and the third set temperature trajectory is variable.

In addition, preferably, the heat treatment system is divided into a plurality of zones capable of being individually heated; first set temperature trajectories are determined for the zones of the heat treatment system, respectively; the first set temperature trajectories for the zones are different from each other; second set temperature trajectories are determined for the zones of the heat treatment system, respectively; the second set temperature trajectories for the zones are different from each other; third set temperature trajectories are determined for the zones of the heat treatment system, respectively; and the third set temperature trajectories for the zones are different from each other.

In addition, the invention is a method of determining set temperature trajectories for a heat treatment system that continuously conducts a first heat treatment process and a second heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the second heat treatment process conducted to the second test object to be processed; and determining a second set temperature trajectory for the second heat treatment process by correcting the temporary second set temperature trajectory on the basis of the measured result of the second heat treatment process.

In this case, set temperatures in a reaction tube concerning the result of each of the continuous heat treatment processes can be optimized. In this case, an optimum set temperature is determined for the first heat treatment process, i.e., the preceding heat treatment process, and then an optimum set temperature is determined for the second heat treatment process, i.e., the succeeding heat treatment process. Thus, readjustments of the optimum set temperature for the first heat treatment process is unnecessary, and hence the optimum set temperatures for the interior of the reaction tube can be efficiently determined.

In addition, the invention is a method of continuously conducting a first heat treatment process and a second heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the first heat treatment process and the second heat treatment process conducted to the second test object to be processed; determining a second set temperature trajectory for the second heat treatment process by correcting the temporary second set temperature trajectory on the basis of the measured result of the first heat treatment process and the second heat treatment process; conducting the first heat treatment process to the object to be processed, by using the determined first set temperature trajectory; and conducting the second heat treatment process to the object to be processed to which the first heat treatment process has been conducted, by using the determined second set temperature trajectory.

Alternatively, the invention is a method of continuously conducting a first heat treatment process, a second heat treatment process and a third heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the first heat treatment process and the second heat treatment process conducted to the second test object to be processed; determining a second set temperature trajectory for the second heat treatment process by correcting the temporary second set temperature trajectory on the basis of the measured result of the first heat treatment process and the second heat treatment process; conducting the third heat treatment process to a third test object to be processed to which the first heat treatment process has been conducted by using the determined first set temperature trajectory and to which the second heat treatment process has been conducted by using the determined second set temperature trajectory, by using a temporary third set temperature trajectory; measuring a result of the first heat treatment process, the second heat treatment process and the third heat treatment process conducted to the third test object to be processed; determining a third set temperature trajectory for the third heat treatment process by correcting the temporary third set temperature trajectory on the basis of the measured result of the first heat treatment process, the second heat treatment process and the third heat treatment process; conducting the first heat treatment process to the object to be processed, by using the determined first set temperature trajectory; conducting the second heat treatment process to the object to be processed to which the first heat treatment process has been conducted, by using the determined second set temperature trajectory; and conducting the third heat treatment process to the object to be processed to which the first heat treatment process and the second heat treatment process have been conducted, by using the determined third set temperature trajectory.

Alternatively, the invention is a method of continuously conducting a first heat treatment process and a second heat treatment process to an object to be processed, said method comprising the steps of: conducting the first heat treatment process to a first test object to be processed, by using a temporary first set temperature trajectory; measuring a result of the first heat treatment process conducted to the first test object to be processed; determining a first set temperature trajectory for the first heat treatment process by correcting the temporary first set temperature trajectory on the basis of the measured result of the first heat treatment process; conducting the second heat treatment process to a second test object to be processed to which the first heat treatment process has been conducted by using the determined first set temperature trajectory, by using a temporary second set temperature trajectory; measuring a result of the second heat treatment process conducted to the second test object to be processed; determining a second set temperature trajectory for the second heat treatment process by correcting the temporary second set temperature trajectory on the basis of the measured result of the second heat treatment process; conducting the first heat treatment process to the object to be processed, by using the determined first set temperature trajectory; and conducting the second heat treatment process to the object to be processed to which the first heat treatment process has been conducted, by using the determined second set temperature trajectory.

BRIEF DESCRIPTION OF THE DRAWINGS

FIG. 15 is a table showing elements of a gate-oxide-film deposition process in an embodiment of the present invention and elements of a gate-oxide-film deposition process in a comparative example.

DESCRIPTION OF THE PREFERRED EMBODIMENTS

Preferred embodiments of the present invention will be described in connection with the accompanying drawings.

Figure 1A:
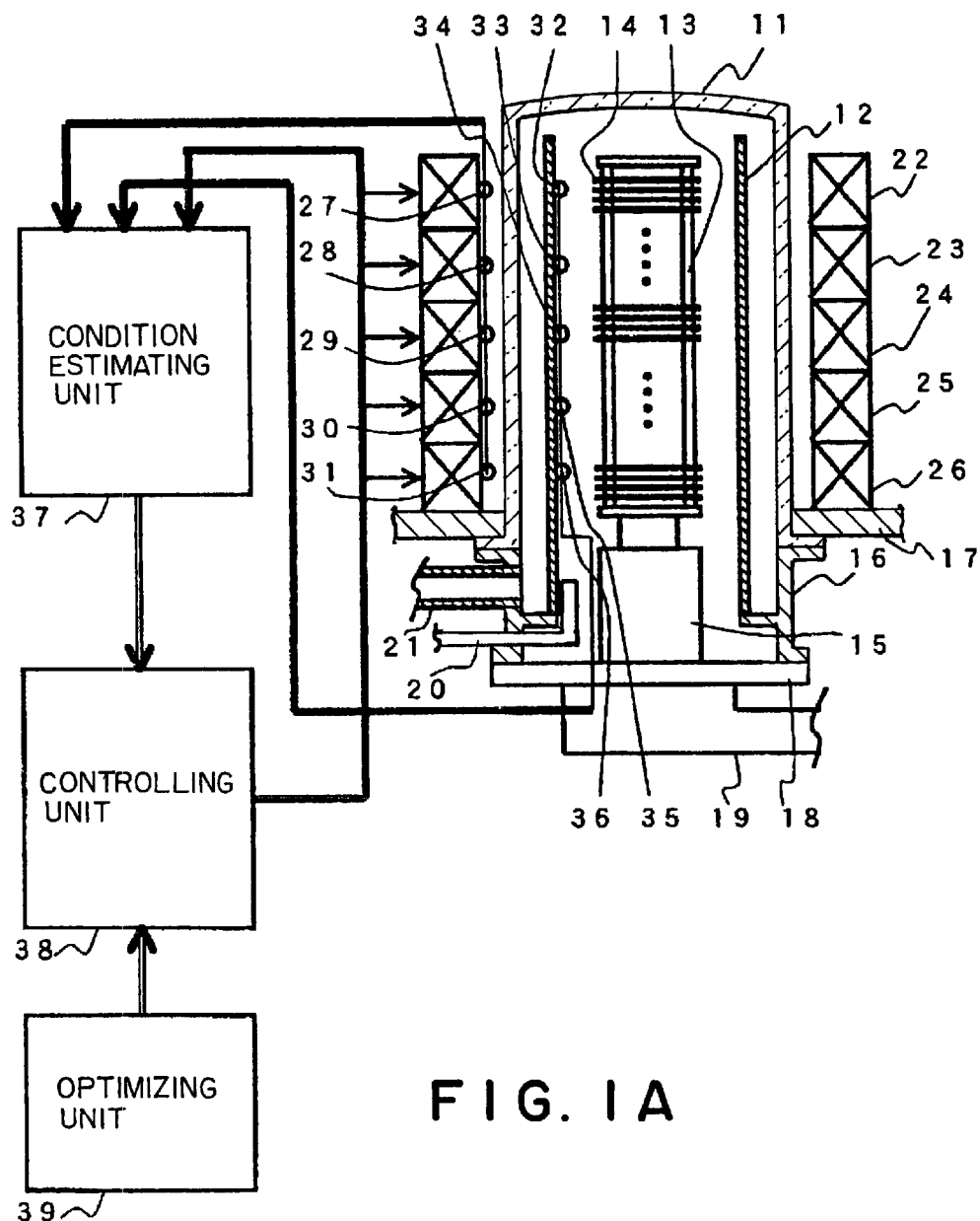
FIGS. 1A and 1B are schematic views of assistance in explaining a preferred embodiment of the present invention.
Figure 1B:
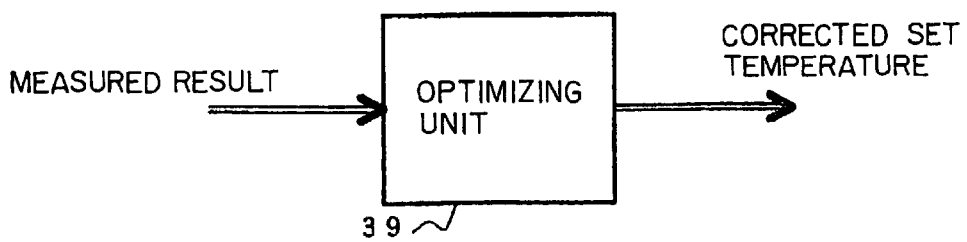

FIGS. 1A and 1B are views of assistance in explaining a preferred embodiment of the present invention. As shown in FIG. 1A, this embodiment is a heat treatment system including a reaction tube 11, peripheral devices associated with the reaction tube 11, a condition estimating unit 37, a controlling unit 38, and an off-line optimizing unit 39. The reaction tube 11 and its peripheral devices are shown in a sectional view, and the condition estimating unit 37, the controlling unit 38 and the optimizing unit 39 are shown in a block diagram.

The reaction tube 11 has a closed upper end. The lower end of the reaction tube 11 is held hermetically between the lower surface of a base plate 17 and the upper end of a manifold 16. An inner tube 12 has an open upper end, and a lower end held on a support projecting from the inner surface of the manifold 16.

A wafer boat 13 supporting a plurality of wafers 14, i.e., objects to be processed, for example, one hundred fifty wafers, in a horizontal posture at vertical intervals is placed in the reaction tube 11. The wafer boat 13 is supported on a lid 18 via a thermal insulating cylinder 15. The lid 18 is mounted on a boat elevator 19 for carrying the wafer boat 13 into and out of the reaction tube 11. The lid 18 is raised to its upper limit position to close the lower open end of the manifold 16, i.e., the lower open end of a processing vessel consisting of the reaction tube 11 and the manifold 16.

Annular heaters 22 to 26 including, for example, resistance heating elements are disposed so as to surround the reaction tube 11. The heaters 22 to 26 are stacked axially, i.e., stacked in the direction of arrangement of the wafers 14. The respective heat generating rates of the heaters 22 to 26 are controlled individually by the controlling unit 38.

A gas supply pipe 20 is extended into the manifold 16 to supply gases into the inner tube 12. An exhaust pipe 21 is connected to the manifold 16 to exhaust gases from an annular space between the inner tube 12 and the reaction tube 11. Usually, a plurality of gas supply pipes are connected to the manifold 16 to supply a plurality of kinds of gases into the inner tube 12. However, only the single gas supply pipe 20 is shown for simplicity. The exhaust pipe 21 is provided with a pressure regulator, not shown, to regulate the pressure in the reaction tube 11.

Outside thermocouples 27 to 31 are attached to the inner side surfaces of the heaters 22 to 26, respectively, to measure the temperatures of parts of the heaters 22 to 26 to which the outside thermocouples 27 to 31 are attached. Inside thermocouples 32 to 36 are attached to the inner side surface of the inner tube 12 at positions corresponding to those of the outside thermocouples 27 to 31, respectively, to measure the temperatures of parts of the inner tube 12 to which the thermocouples 32 to 36 are attached.

Signals representing temperatures measured by the outside thermocouples 27 to 31 and the inside thermocouples 32 to 36 are given to the condition estimating unit 37. Control signals for controlling the heaters 22 to 26 are also given to through the controlling unit 38 to the condition estimating unit 37. The condition estimating unit 37 estimates the condition (temperature) of the wafers 14 being processed by a heat treatment process in the reaction tube 11 from the measured temperatures and the control signals. This estimation is necessary because it is very difficult to measure the temperature of the wafers 14 directly while the heat treatment process is conducted to the wafers 14. The temperature of the wafers 14 is a parameter directly relating to the deposition of the film on the wafers 14, and hence the control of the temperature of the wafers 14 is essentially necessary.

A predetermined model is used for estimating the temperature of the wafers 14 from the control signals for controlling the heaters 27 to 31 and the temperatures measured by the outside thermocouples 27 to 31 and the inside thermocouples 32 to 36. The model is stored in the condition estimating unit 37. Thus, the condition estimating unit 37 is adapted to estimate the temperature of the wafers 14 from the control signals for controlling the heaters 27 to 31 and the temperatures measured by the outside thermocouples 27 to 31 and the inside thermocouples 32 to 36.

The model may be designed to estimate the temperatures of the plurality of wafers 14 at optional positions on the wafer boat 13 among those supported on the wafer boat 13. In the following description, it is supposed that the respective temperatures of five wafers in five zones, i.e., an upper zone, an upper middle zone, a middle zone, a lower middle zone and a lower zone, respectively, of the wafer boat 13 are estimated.

The model may be designed to estimate the temperatures of a plurality of parts, such as a peripheral part and a central part, of the single wafer 14. The estimation of the temperatures of such two parts of the wafer is useful in creating a proper temperature gradient between the peripheral and the central part of the wafer 14 by utilizing the rate of thermal conduction in the wafer 14.

Estimated temperatures of the wafers 14 are given to the controlling unit 38. The controlling unit 38 compares the estimated temperatures with a set temperature and calculates proper control signals. The calculated control signals are given to the heaters 22 to 26 and the condition estimating unit 37.

The set temperature is an optimum temperature for ordinary semiconductor device fabrication determined through optimization. The optimization means repetition of correction to obtain the result of heat treatment process in an allowable range, such as formation of a film of a predetermined thickness. The present invention is featured by a method of determining an optimum set temperature (set temperature trajectory). To determine an optimum set temperature, test wafers are placed in the heat treatment system shown in FIG. 1A prior to a practical semiconductor device fabricating operation. The test wafers are processed by a film deposition process, and the processed test wafers are measured to obtain data on the result of film deposition. The data on the result of film deposition is given to the off-line optimizing unit 39 as shown in FIG. 1B. Then, the optimizing unit 39 outputs a corrected set temperature. The heat treatment system shown in FIG. 1A conducts the film deposition process to other test wafers by using the corrected set temperature. The processed test wafers are measured to obtain data on the result of film deposition. The optimizing unit 39 may be a personal computer storing predetermined programs.

Control variables in the heat treatment system shown in FIG. 1A include flow rates of gasses carried by the gas supply pipe 20 and the pressure in the reaction tube 11. Those parameters are not directly related with the present invention and hence the description and illustration thereof will be omitted.

Incidentally, the set temperature, the flow rates of gases and the pressure in the reaction tube 11 are dependent on the type and the thickness of a film to be deposited by a film deposition process, i.e., a heat treatment process. A processing design specifying process conditions including a set temperature, flow rates of gases and the pressure in the reaction tube 11 for a specific film is called a recipe. This embodiment is not directly related with the flow rates of gases and the pressure in the reaction tube 11 and is related with the set temperature.

Figure 2:
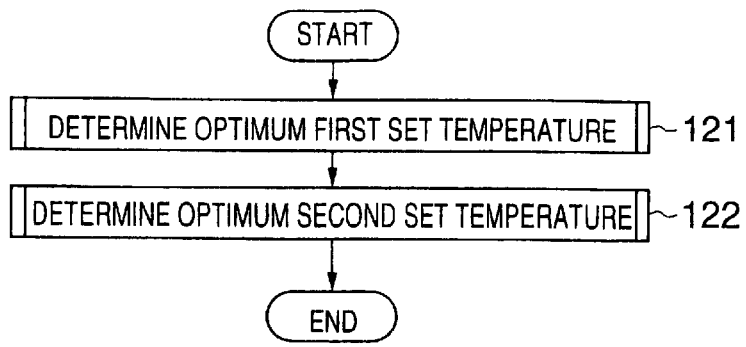
FIG. 2 is a flow chart of an optimum set temperature determining procedure for determining optimum set temperatures in a reaction tube corresponding to the outputs of a plurality of heaters for forming two films continuously.
Figure 3:
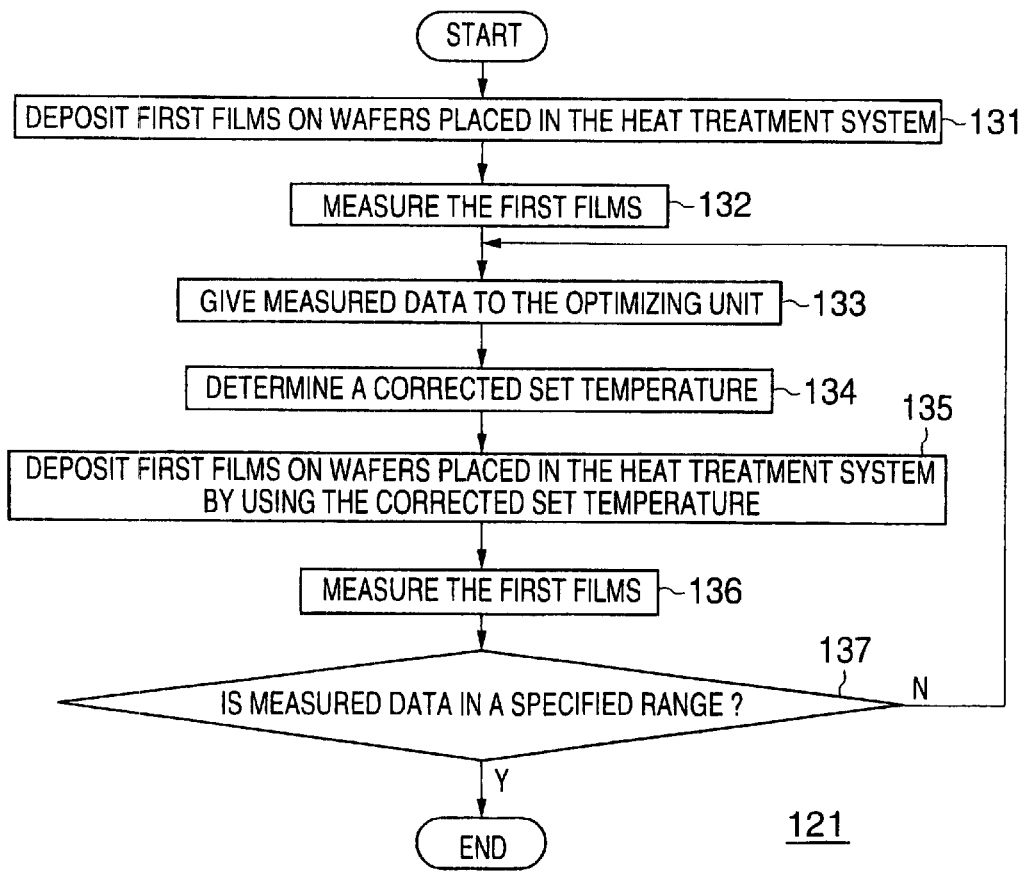
FIG. 3 is a flow chart of step 121 shown in FIG. 2.
Figure 4:
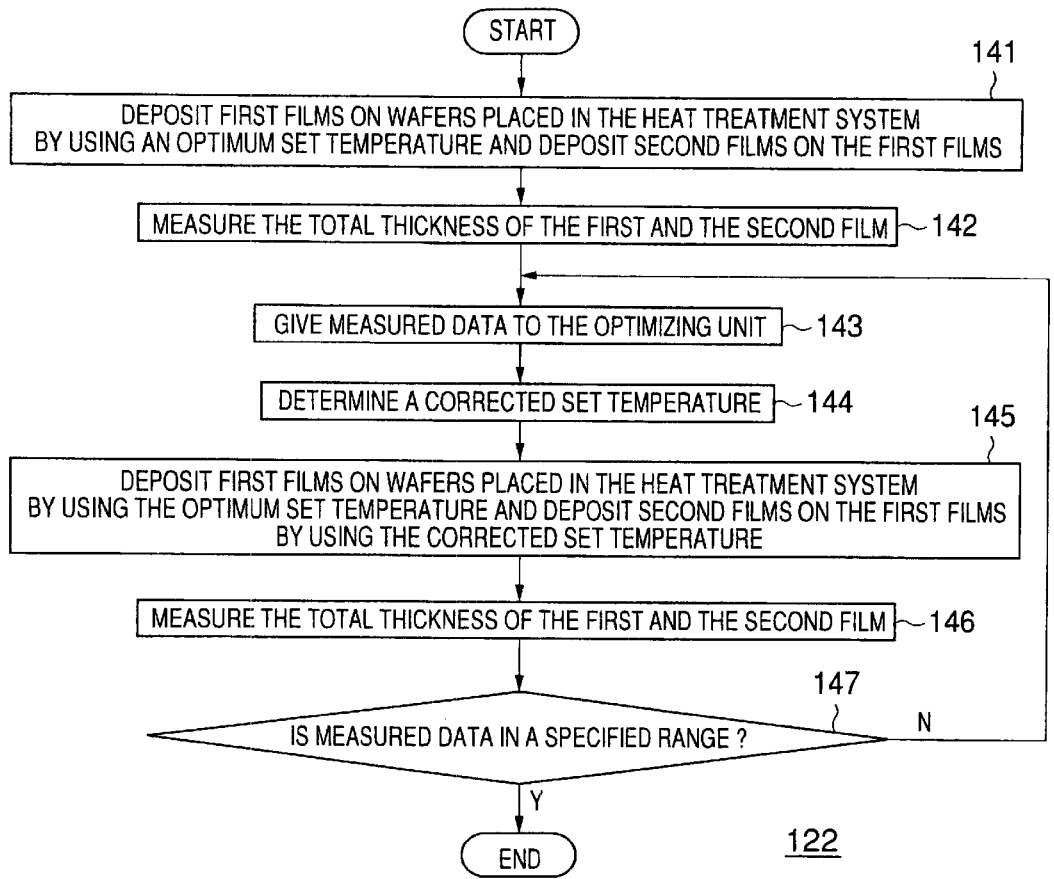
FIG. 4 is a flow chart of step 122 shown in FIG. 2.

A procedure for determining the set temperature for the heat treatment system shown in FIG. 1 will be described with reference to FIGS. 2 to 4. FIGS. 2 to 4 are flow charts of an optimum set temperature determining procedure for determining optimum set temperatures in the reaction tube corresponding to the outputs of the plurality of heaters for forming two films continuously. The two films are formed continuously in layers. In this example, the respective thicknesses of the two films forming the two-layer film cannot be individually measured and only the sum of those thicknesses can be measured. This case corresponds to a case where a nitride film is formed and an another nitride film is formed on the former.

Suppose that the thickness of the two-layer film is required to be in a predetermined thickness range about a specific value, such as a range of 4 nm±0.5%, and the thickness of a first film, i.e., a lower film, is required to be in a predetermined thickness range about a specific value, such as 1.5 nm±1.0%.

To meet such requirements, an optimum set temperature (set temperature trajectory) for depositing the first film, i.e., the lower film, is determined in step 121 shown in FIG. 2, and then an optimum set temperature (set temperature trajectory) for depositing the second film, i.e., the upper film, is determined in step 122.

Referring to FIG. 3, to determine an optimum first set temperature for depositing the first film, a plurality of test wafers are subjected to a first film deposition process in the heat treatment system shown in FIG. 1A in step 131. The plurality of wafers includes five wafers held in an upper zone, an upper middle zone, a middle zone, a lower middle zone and a lower zone of the wafer boat 13, respectively. Usually, the first film deposition process for forming the first film is followed continuously by a second film deposition process for forming the second film without unloading the test wafers from the heat treatment system. However, in this embodiment, the test wafers are unloaded from the heat treatment system after the first films have been formed on the test wafers. The first film deposition process uses a standard temperature for all the five test wafers.

The thickness of the first film formed on each of the unloaded test wafers is measured by a film thickness measuring instrument, such as an ellipsometer, in step 132. Data on the result of film deposition is given to the optimizing unit 39 shown in FIG. 1B in step 133. The optimizing unit 39 calculates and outputs a corrected first set temperature in step 134.

A physical model representing the relationship between values of parameters including temperature, and film thickness which grows is stored beforehand in the optimizing unit 39. The optimizing unit 39 uses the model for the calculation. A corrected first set temperature considered to be more appropriate can be derived from the data on the result of film deposition and the current first set temperature, by using the model.

Then, other test wafers are subjected to a film deposition process using the corrected first set temperature in the heat treatment system shown in FIG. 1A in step 135. The test wafers are unloaded from the heat treatment system after first films have been deposited on the test wafers. The thickness of the first film deposited on each of the test wafers is measured by the film thickness measuring instrument, such as an ellipsometer in step 136.

Measured thickness is compared with the predetermined thickness range, such as 1.5 nm±1.0%, in step 137. If the measured thickness is in this predetermined thickness range, the procedure for determining an optimum first set temperature for depositing the first film is completed. Thus, the corrected first set temperature (corrected set temperature trajectory) used for depositing the films is the optimum first set temperature (set temperature trajectory).

If the measured thickness does not fall in the predetermined thickness range, the procedure returns to step 133. Then, the result of film deposition (measured thickness) is given to the optimizing unit 39, and the optimizing unit 39 calculates another corrected first set temperature. Thus, the optimum first set temperature (corrected first set temperature) suitable for depositing the first film having a thickness falling in the predetermined thickness range may be finally obtained.

Thus, the optimum first set temperature proper for depositing a first film meeting required specifications (qualities) can be determined by depositing only the first film out of the two films by the first film deposition process and measuring the thickness of the deposited first films.

Subsequently, an optimum second set temperature suitable for depositing the second film, i.e., the upper film, is determined. As shown in FIG. 4, first, first films are formed on a plurality of test wafers held in the heat treatment system by using the optimum first set temperature as determined above, and a second film depositing process is carried out to deposit second films on the first films in step 141 continuously with the first film deposition process without unloading the test wafers from the heat treatment system after the deposition of the first films. The plurality of test wafers include five wafers held in an upper zone, an upper middle zone, a middle zone, a lower middle zone and a lower zone of the wafer boat 13, respectively. The second film deposition process uses a standard temperature for all the five test wafers. After the first film and the second film have been deposited in layers on each of the test wafers, the test wafers are unloaded form the heat treatment system.

The thickness of sum of the first film and the second film formed on each of the unloaded test wafers is measured by a film thickness measuring instrument, such as an ellipsometer, in step 142. In this case, the respective thicknesses of the first film and the second film are not measured individually. Data on the result of film deposition is given to the optimizing unit 39 shown in FIG. 1B in step 143. The optimizing unit 39 calculates and outputs a corrected second set temperature in step 144.

A physical model representing the relationship between values of parameters including temperature, and film thickness which grows is stored beforehand in the optimizing unit 39. The optimizing unit 39 uses the model for the calculation. A corrected second set temperature considered to be more appropriate can be derived from the data on the result of film deposition and the current second set temperature, by using the model, which is substantially similar to the procedure for determining the optimum first set temperature.

Then, first and second films are deposited continuously on other test wafers using the corrected second set temperature (set temperature trajectory) for depositing the second films' by the heat treatment system shown in FIG. 1A in step 145. The test wafers are unloaded from the heat treatment system after the first and the second film have been deposited on each of the test wafers.

The thickness of a two-layer film consisting of the first and the second film deposited on each of the test wafers is measured by the film thickness measuring instrument, such as an ellipsometer, in step 146.

Measured thickness is compared with the predetermined thickness range, such as 4 nm±0.5%, in step 147. If the measured thickness is in this predetermined thickness range, the procedure for determining an optimum second set temperature for depositing the second film is completed. Thus, the corrected second set temperature (corrected set temperature trajectory) used for depositing the second films is the optimum second set temperature (set temperature trajectory).

If the measured thickness does not fall in the predetermined thickness range, the procedure returns to step 143. Then, the result of film deposition (measured thickness) is given to the optimizing unit 39, and the optimizing unit 39 calculates another corrected second set temperature. Thus, the optimum second set temperature (corrected set temperature) suitable for depositing the second film having a thickness falling in the predetermined thickness range may be finally obtained.

Thus, this embodiment achieves the determination of the optimum first set temperature and the optimum second set temperature proper for depositing the two-layer film having a thickness (composite result of heat treatment) falling in the predetermined range around the set value and for depositing the first film having a thickness (result of first heat treatment) falling in the predetermined range around the set value. Consequently, the thickness of the second film (result of the second heat treatment) can be managed.

The heat treatment system shown in FIG. 1A is able to achieve a semiconductor device fabricating operation for depositing films meeting the required specifications (qualities) by using the optimum first set temperature and the optimum second set temperature thus determined.

When three of more films are deposited continuously in layers (one on top of another) and the respective thicknesses of the films cannot be individually measured, an optimum set temperature for depositing each of those films can be determined by the foregoing optimum set temperature determining procedure.

When three films, i.e., first, second and third films, are to be deposited on a wafer, a first film deposition process for depositing the first film is performed and an optimum first set temperature is determined. Then, the first film deposition process using the optimum first set temperature and a second film deposition process for depositing the second film are performed continuously and an optimum second set temperature is determined. Then, the first film deposition process using the optimum first set temperature, the second film deposition process using the optimum second set temperature and a third film deposition process for depositing the third film are performed continuously and an optimum third set temperature is determined. Optimum set temperatures for depositing four or more films can be determined in the same way.

Controlled temperature variation of the test wafer processed by the heat treatment system shown in FIG. 1A when determining the optimum first set temperature and the optimum second set temperature will be described with reference to FIGS. 5A to 6B.

Figure 5A:
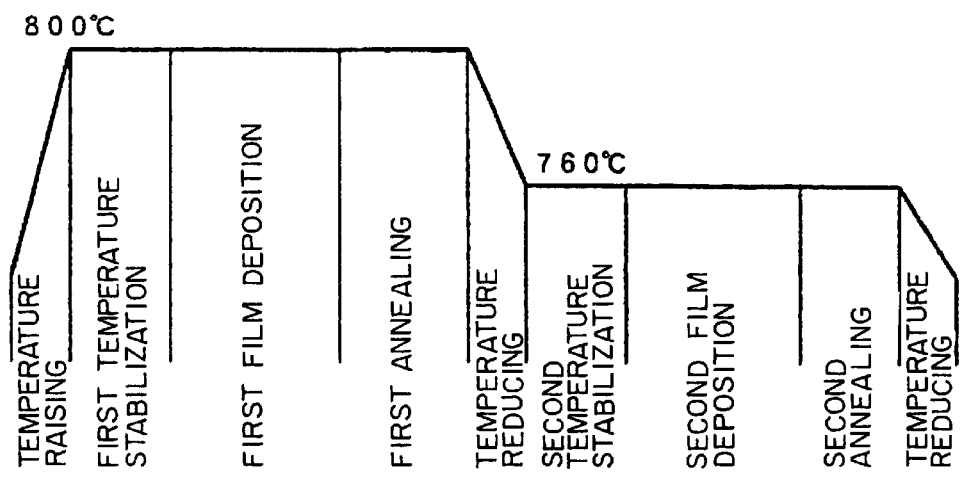
FIGS. 5A to 5C are wafer temperature control diagrams of assistance in explaining an optimum first set temperature determining procedure for determining an optimum first set temperature for depositing a first film.
Figure 5B:
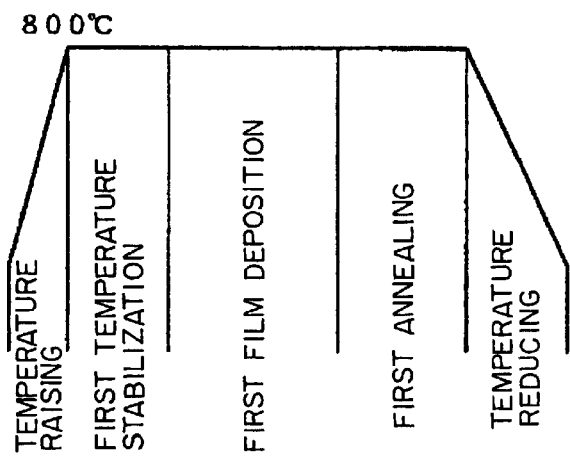
Figure 5C:
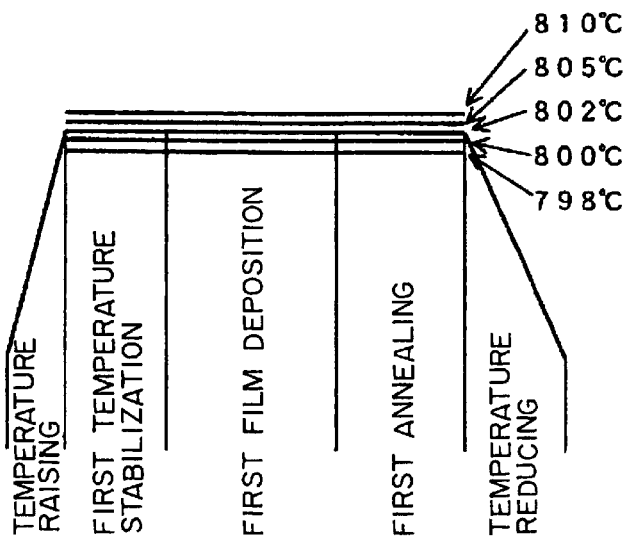

FIGS. 5A to 5C are wafer temperature control diagrams of assistance in explaining an optimum first set temperature determining procedure for determining an optimum first set temperature for depositing a first film. FIG. 5A shows a nominal temperature variation curve representing temperature variation when forming first and second films on a wafer. Referring to FIG. 5A, the wafer is heated to 800° C., the wafer is held at 800° C. for several minutes as a first temperature stabilization process, a first film deposition process is performed to deposit a first film, and then a first annealing process is performed to anneal the first film. The wafer is held at a fixed controlled temperature of 800° C. during the first temperature stabilization process, the first film deposition process and the first annealing process.

Then, the temperature of the wafer is reduced to 760° C., the wafer is held at 760° C. as a second temperature stabilization process, a second film deposition process is performed to deposit a second film, and then a second annealing process is performed to anneal the second film. The wafer is held at a fixed controlled temperature of 760° C. during the second temperature stabilization process, the second film deposition process and the second annealing process. The temperature of the wafer is reduced after the completion of the second annealing process so that the wafer can be unloaded from the heat treatment system.

When the temperature in the first and the second film deposition process is controlled according to the nominal temperature control diagram, the optimum first set temperature (nominal 800° C.) for the first film deposition process is determined by the following procedure.

Referring to FIG. 5B showing a temperature raising process, the first temperature stabilization process, the first film deposition process, the first annealing process and a first temperature reducing process, the first film is deposited by using the nominal temperature as a first set temperature (first set temperature trajectory). The optimizing unit 39 calculates a corrected first set temperature on the basis of data on the result of film deposition and another first film is deposited by the first film deposition process using the corrected first set temperature. These steps of first film deposition and first set temperature correction are repeated until a first film of a thickness meeting the required specifications (qualities) is formed. FIG. 5C shows optimum first set temperatures thus determined. As shown in FIG. 5C, the optimum first set temperatures for the upper, the upper middle, the middle, the lower middle and the lower zone of the wafer boat 13 are, for example, 810° C., 805° C., 802° C., 800° C. and 798° C., respectively. In FIG. 5C, the temperature variation curve is exaggerated to facilitate understanding the difference between the first set temperatures for the upper, the upper middle, the middle, the lower middle and the lower zone of the wafer boat. The same exaggeration is applied to the other diagrams.

Thus, the optimum first set temperatures proper for depositing the first film meeting the required specifications can be determined by depositing only the first film out of the two films by the first film deposition process and measuring the thickness of the deposited first film.

Figure 6A:
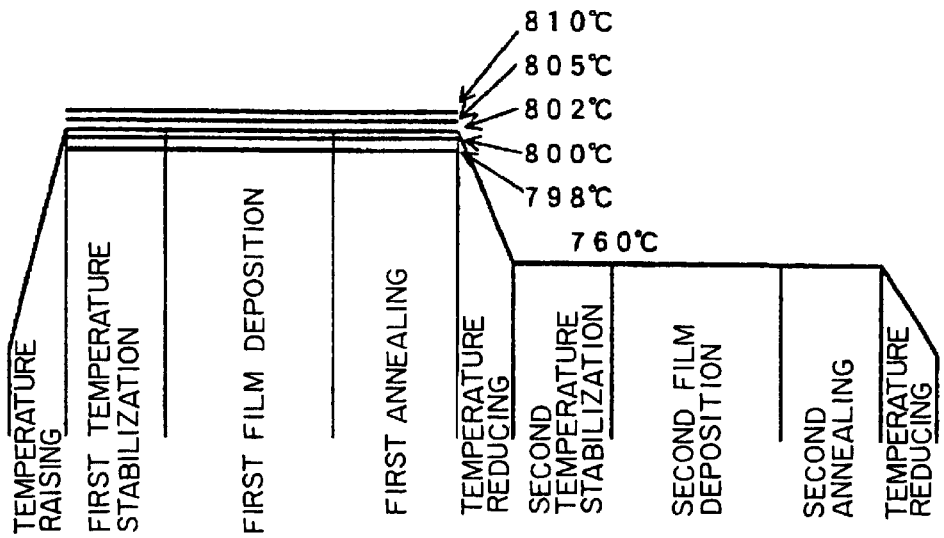
FIGS. 6A and 6B are wafer temperature control diagrams of assistance in explaining an optimum second set temperature determining procedure for determining an optimum second set temperature for depositing a second film.
Figure 6B:
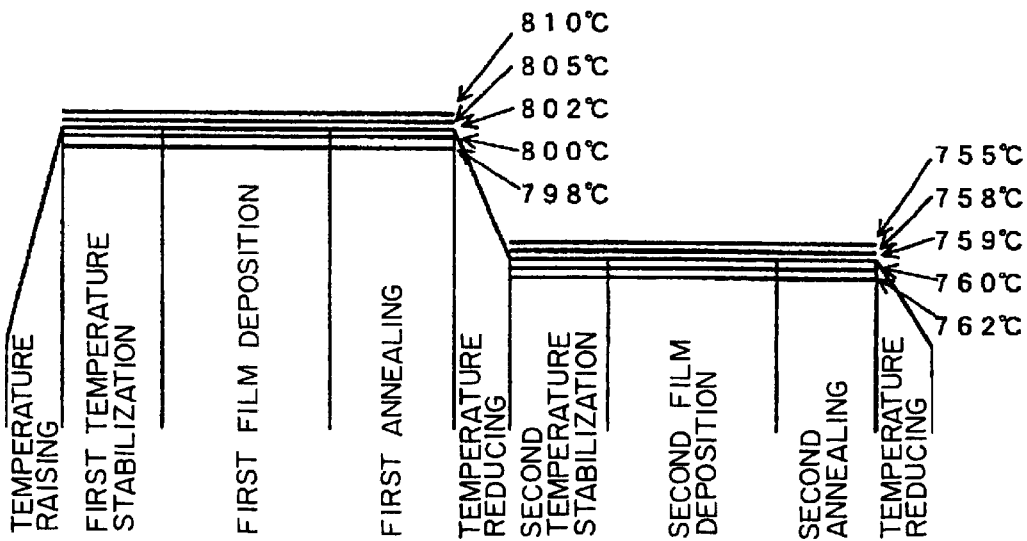

FIGS. 6A and 6B are wafer temperature control diagrams of assistance in explaining an optimum second set temperature determining procedure for determining an optimum second set temperature for depositing a second film. An optimum second set temperature (nominal temperature of 760° C.) for depositing the second film is determined by the following procedure.

Referring to FIG. 6A, a second film deposition process for depositing the second film using the nominal temperature is performed following the first film deposition process using the optimum first set temperature. The optimizing unit 39 calculates a corrected second set temperature on the basis of data on the result of film deposition and a second film is deposited by the second film deposition process using the corrected second set temperature. These steps of second film deposition and second set temperature correction are repeated until a second film of a thickness meeting the required specifications is formed. FIG. 6B shows optimum second set temperatures thus determined. The optimum second set temperatures for the upper, the upper middle, the middle, the lower middle and the lower zone of the wafer boat 13 are, for example, 755° C., 758° C., 759° C., 760° C. and 762° C., respectively, as shown in FIG. 6B.

Thus, it is possible to achieve the determination of the optimum first set temperature and the optimum second set temperature proper for depositing the two-layer film having a thickness (composite result of heat treatment) falling in the predetermined range around the set value and for depositing the first film having a thickness (result of the first heat treatment) falling in the predetermined range around the set value. Consequently, the thickness of the second film (result of the second heat treatment) also can be managed.

Another mode of controlled temperature variation of a test wafer to be used for determining an optimum first set temperature and an optimum second set temperature on the heat treatment system shown in FIG. 1A will be described with reference to FIGS. 7A to 8B.

Figure 7A:
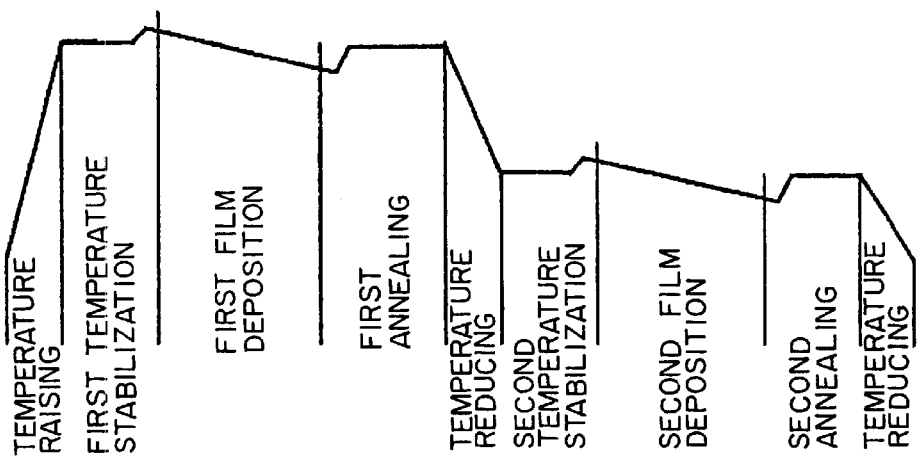
FIGS. 7A to 7C are wafer temperature control diagrams of assistance in explaining an optimum first dynamic set temperature determining procedure for determining an optimum first dynamic set temperature for depositing the first film.
Figure 7B:
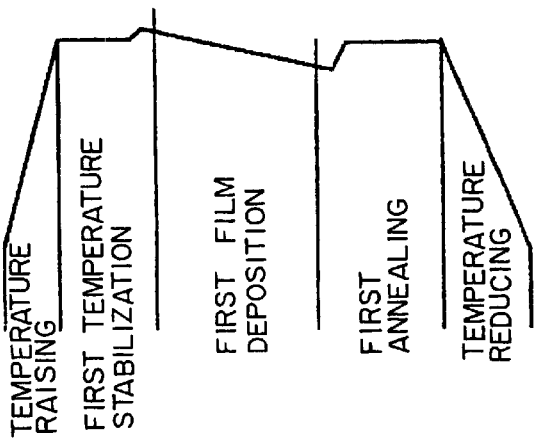
Figure 7C:
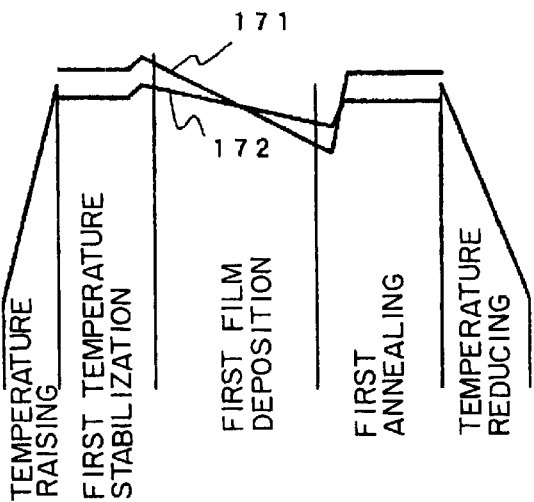

FIGS. 7A to 7C are wafer temperature control diagrams of assistance in explaining an optimum first dynamic set temperature determining procedure for determining an optimum first dynamic set temperature for depositing a first film. FIG. 7A shows a nominal temperature variation curve representing temperature variation when forming first and second films on a wafer (object to be processed). Referring to FIG. 7A, the wafer is heated, the wafer is held at a temperature for several minutes as a first temperature stabilization process, a first film deposition process is performed to deposit a first film, and then a first annealing process is performed to anneal the first film.

In the first film deposition process, the temperature is reduced slightly with time. Thus, the first set temperature for the first film deposition process is not a fixed temperature, but the same is a dynamic set temperature varying with time. Herein, a procedure for determining an optimum first dynamic set temperature will be explained. The first set temperature is reduced gradually with time during the first film deposition process in order to heat a central part of the wafer to a relatively high temperature and to heat a peripheral part of the wafer to a relatively low temperature.

Such a temperature variation is effective in reducing dispersion of film thickness distribution on each wafer, i.e., intra-wafer film thickness distribution, as well as in reducing difference in thickness between films formed on wafers, i.e., dispersion of inter-wafer film thickness distribution. A proper temperature gradient can be created between the peripheral and the central part of the wafer by utilizing the rate of thermal conduction in the wafer by varying the set temperature during the first film deposition process.

For example, if the central part and the peripheral part of the wafer are exposed to atmospheres of different film deposition conditions, such as atmospheres of different source gas concentrations, respectively, the effect of the different film deposition conditions can be offset by the proper temperature gradient.

Figure 9A:
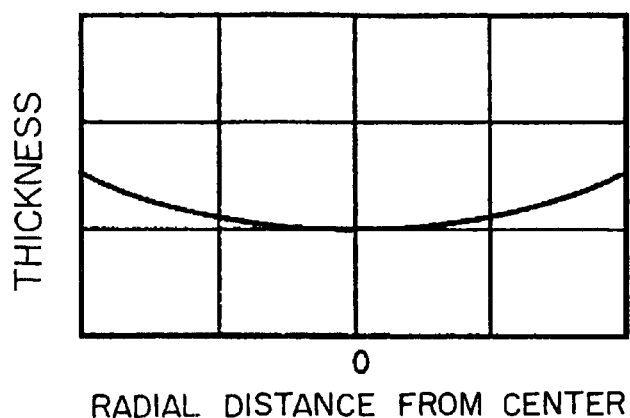
FIGS. 9A to 9C are diagrams of assistance in explaining the effect of reducing temperature on forming a film on a wafer in a uniform thickness.

For example, if the set temperature is not reduced during the first film deposition process, a film formed on a wafer has a thickness as shown in FIG. 9A. As shown in FIG. 9A, usually, the thickness of the film on a central part of the wafer is smaller than that of the film on a peripheral part of the wafer, which may be mainly caused by the difference in source gas concentration between regions corresponding to the central and the peripheral part of the wafer. The source gas flows from a peripheral part toward a central part of the wafer and is consumed while the same is flowing toward the central part of the wafer, and hence the source gas concentration decreases from the peripheral part toward the central part of the wafer. Consequently, the thickness of the central part of the film is slightly smaller than that of the peripheral part of the film by, for example, a fraction of 1 nm. In the following description, a characteristic of the heat treatment system that forms a film having thickness distribution as shown in FIG. 9A will be called a cup characteristic.

Figure 9B:
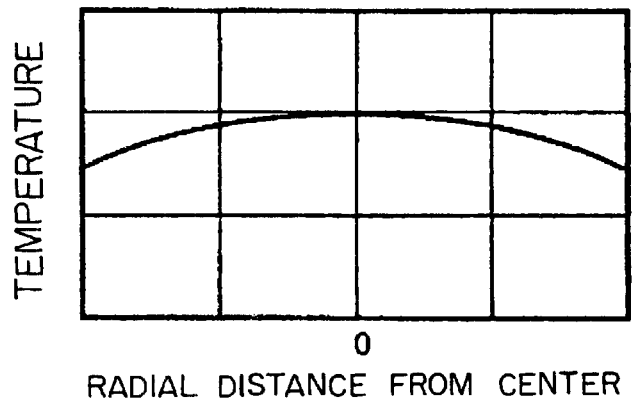
Figure 9C:
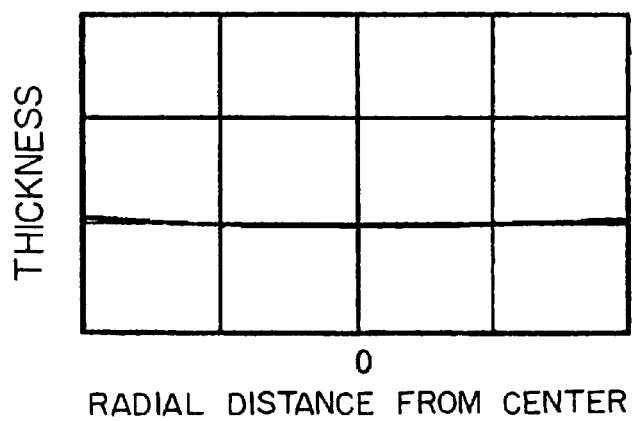

Accordingly, as shown in FIG. 9B, it is preferable to control the temperature of the wafer in such a manner that the temperature of a central part of the wafer is slightly higher than that of a peripheral part by, for example, several degrees centigrade. For such a purpose, the temperature during the first film deposition process is reduced slightly with time. Then, heat is transferred by conduction from the central part toward the peripheral part of the wafer, and a temperature gradient indicating the reduction of temperature from the central part toward the peripheral part of the wafer is created. Consequently, as shown in FIG. 9C, the film can be deposited on the wafer in a highly uniform thickness.

Referring again to FIG. 7A, the temperature is reduced after the first annealing process in order to start deposition of the second film. Then, similarly, a second stabilizing process, a second film deposition process and a second annealing process are carried out. In the second film deposition process, a second set temperature is decreased slightly with time during the deposition of the second film. Herein, a procedure for determining an optimum second dynamic set temperature will be explained. After the completion of the second annealing process, the temperature is reduced and the wafer is unloaded form the heat treatment system.

When the temperature in the first and the second film deposition process is controlled according to the nominal temperature control diagram, the optimum first dynamic set temperature for the first film deposition process is determined by the following procedure.

FIG. 7B shows a section of the wafer temperature control diagram for the heating (temperature raising) process, the first stabilizing process, the first film deposition process, the first annealing process and the first temperature reducing process. The first film is deposited by using the nominal temperature as a first dynamic set temperature. The optimizing unit 39 calculates a corrected first dynamic set temperature on the basis of data on the result of film deposition, and then another first film is deposited by using the corrected first dynamic set temperature. These steps of first film deposition and first dynamic set temperature correction are repeated until a first film of a thickness meeting the required specifications is formed. FIG. 7C shows optimum first dynamic set temperatures thus determined. As shown in FIG. 7C, the first dynamic set temperature for wafers held in an upper zone of the wafer boat 13 is controlled according to a temperature control diagram 171, and the first dynamic set temperature for wafers held in a lower zone of the wafer boat 13 is controlled according to a temperature control diagram 172. Temperature control diagrams for controlling the first dynamic set temperatures for wafers held in an upper middle, a middle and a lower middle zone of the wafer boat 13, which can be determined by the same procedure, are omitted in FIG. 7C.

Thus, the first dynamic set temperature proper for depositing the first film meeting required qualities specifying an allowable inter-wafer thickness dispersion (difference) range and an allowable intra-wafer thickness dispersion (difference) range can be determined by depositing and measuring only the first film out of the two films to be continuously deposited.

Figure 8A:
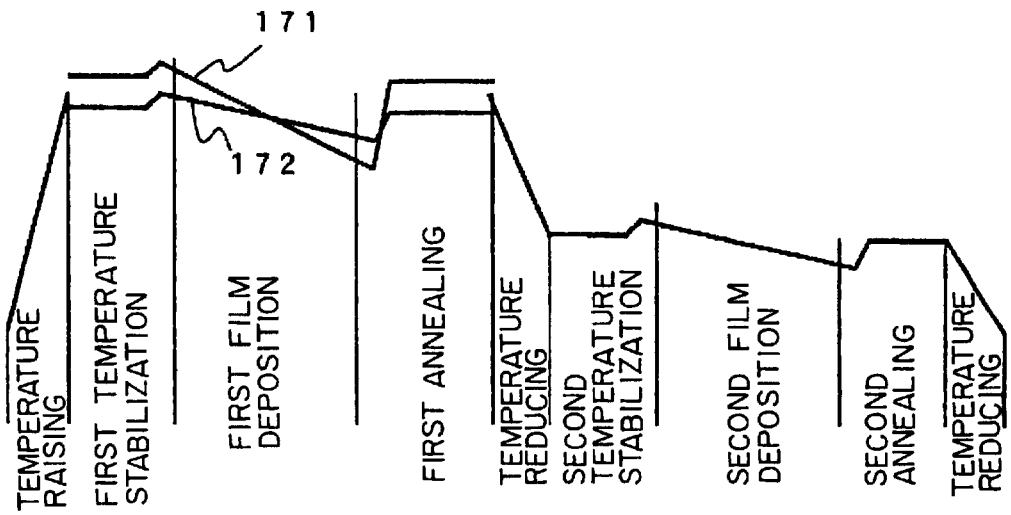
FIGS. 8A and 8B are wafer temperature control diagrams of assistance in explaining an optimum second dynamic set temperature determining procedure for determining an optimum second dynamic set temperature for depositing the second film.
Figure 8B:
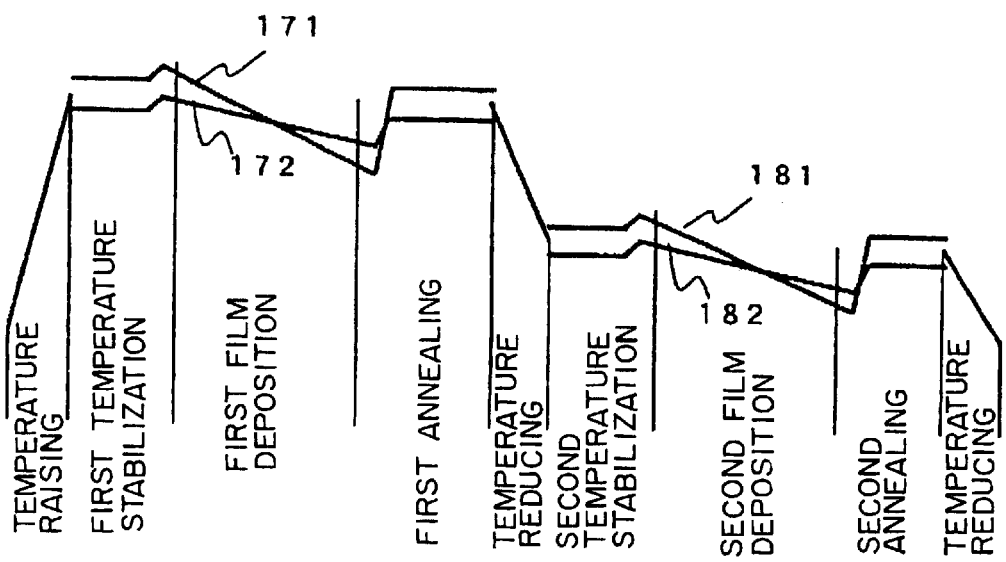

FIGS. 8A and 8B are wafer temperature control diagrams of assistance in explaining a procedure for determining an optimum second dynamic set temperature for depositing a second film. An optimum second dynamic set temperature for depositing the second film is determined by the following procedure.

Referring to FIG. 8A, a second film deposition process for depositing the second film using the nominal second dynamic set temperature is performed following the first film deposition process using the optimum first dynamic set temperature. The optimizing unit 39 calculates a corrected second dynamic set temperature on the basis of data on the result of film deposition and a second film is deposited by the second film deposition process using the corrected second dynamic set temperature. These steps of second film deposition and second dynamic set temperature correction are repeated until a second film of a thickness meeting the required specifications is formed. FIG. 8B shows optimum second dynamic set temperatures thus determined. As shown in FIG. 8B, the second dynamic set temperature for wafers held in an upper zone of the wafer boat 13 is controlled according to a temperature control diagram 181, and the second dynamic set temperature for wafers held in a lower zone of the wafer boat 13 is controlled according to a temperature control diagram 182. Temperature control diagrams for controlling the second dynamic set temperatures for wafers held in an upper middle, a middle and a lower middle zone of the wafer boat 13, which can be determined by the same procedure, are omitted in FIG. 8B.

Thus, it is possible to achieve the determination of the optimum first dynamic set temperature and the optimum second dynamic set temperature proper for depositing the two-layer film having a thickness (composite result of heat treatment) falling in the predetermined range around the set value, for depositing the first film, i.e., the lower film, having a thickness (result of the first heat treatment) falling in the predetermined range around the set value and for meeting required qualities specifying an allowable inter-wafer thickness dispersion (difference) range and an allowable intra-wafer thickness dispersion (difference) range. Consequently, the thickness of the second film (result of the second heat treatment) also can be managed.

Figure 10A:
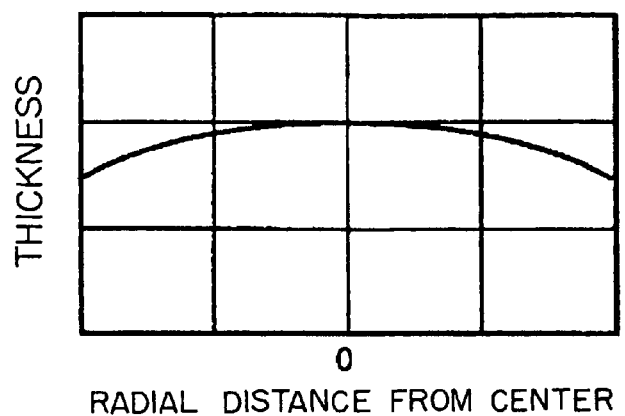
FIGS. 10A to 10C are diagrams of film thickness distribution on wafers held on a wafer boat.
Figure 10B:
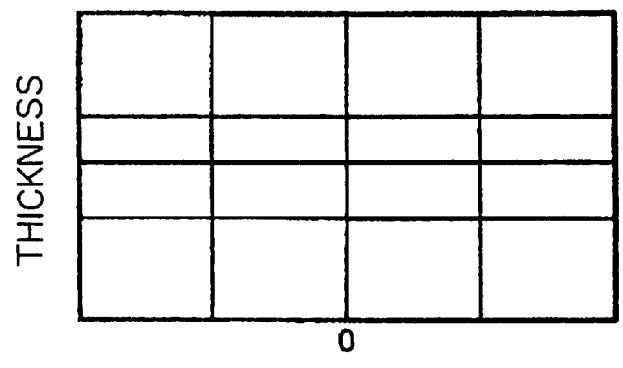
Figure 10C:
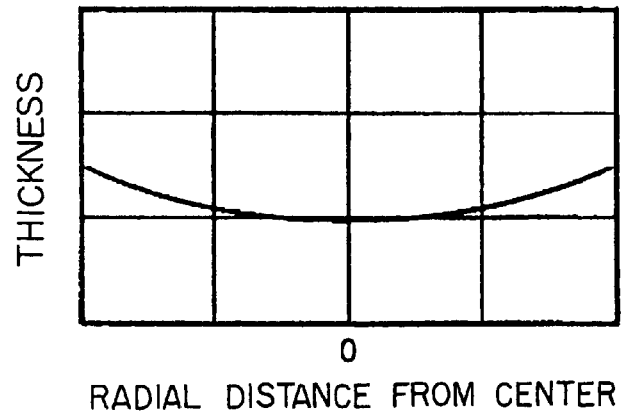

The use of the optimum dynamic set temperatures improves the uniformity of the films when films having a thickness as shown in FIG. 10A are formed on wafers held in an upper zone of the wafer boat 13 (FIG. 1), films having a thickness as shown in FIG. 10B are formed on wafers held in a middle zone of the wafer boat 13 and films having a thickness as shown in FIG. 10C are formed on wafers held in a lower zone of the wafer boat 13 if the set temperatures are not varied dynamically.

The film has the aforesaid thickness distribution when the difference between film deposition conditions in the reaction tube is complex. For example, the film has the aforesaid thickness distribution when the gas is supplied into the reaction tube through an upper part of the reaction tube and the gas decomposes gradually in the reaction tube to deposit the film in addition to one or more factors causing the cup characteristic as shown in FIG. 9A.

In such a state, a factor that makes the thickness of the film on a central part of wafer greater than that on a peripheral part of the wafer is added. Such a factor will be referred to as a cap characteristic. The additional factor does not affect significantly the thickness difference between a peripheral part and a central part of a film formed on a wafer held in a lower zone of the wafer boat. When the additional factor is superposed on the intrinsic cup characteristic of the heat treatment system shown in FIG. 1A, the cap characteristic is dominant in an upper zone of the wafer boat and the heat treatment system exhibits a cap characteristic (FIG. 10A). In a middle zone of the wafer boat, the cap characteristic and the cup characteristic offset each other and the film has a substantially uniform thickness as shown in FIG. 10B. In a lower zone of the wafer boat, the cup characteristic is dominant and the heat treatment system exhibits a cup characteristic (FIG. 10C).

As obvious from film thickness distributions shown in FIGS. 10A to 10C, when depositing a film on wafers, a slightly rising dynamic set temperature is used for the wafers held in an upper zone of the wafer boat, a constant (static) set temperature is used for the wafers held in a middle zone of the wafer boat and a slightly falling dynamic set temperature is used for the wafers held in a lower zone of the wafer boat in order to form films having a uniform thickness.

As mentioned above, it is possible to achieve the determination of the optimum first dynamic set temperature and the optimum second dynamic set temperature proper for depositing the two-layer film having a thickness (composite result of heat treatment) falling in the predetermined range around the set value, for depositing the first film, i.e., the lower film, having a thickness (result of the first heat treatment) falling in the predetermined range around the set value and for meeting required qualities specifying an allowable inter-wafer thickness dispersion range and an allowable intra-wafer thickness dispersion range. Consequently, the thickness of the second film (result of the second heat treatment) also can be managed.

Figure 11:
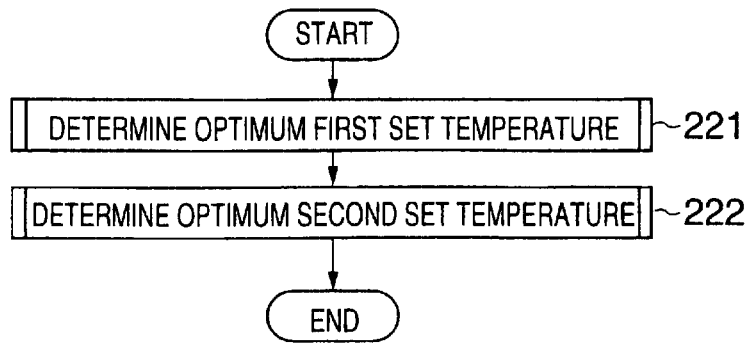
FIG. 11 is a flow chart, different from those shown in FIGS. 2 to 4, of an optimum set temperature determining procedure for determining optimum set temperatures in a reaction tube corresponding to the outputs of a plurality of heaters for two films which are formed continuously.
Figure 12:
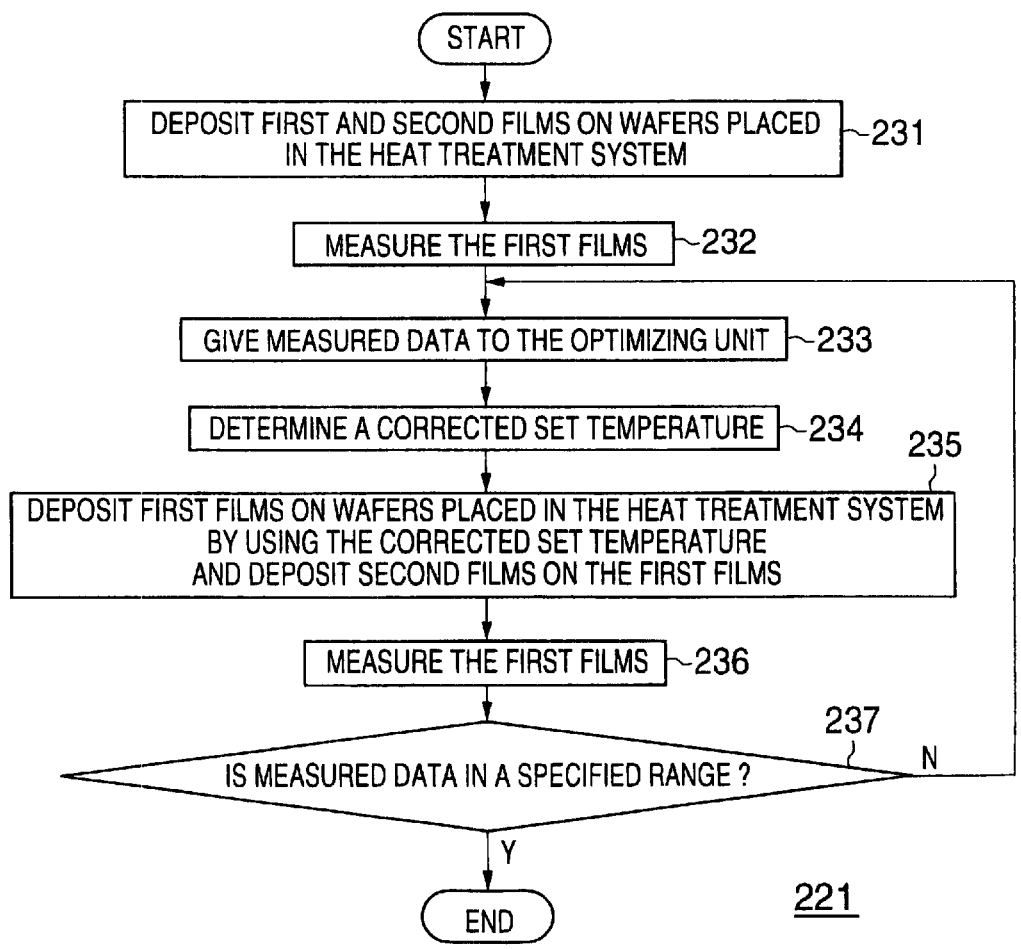
FIG. 12 is a flow chart of step 221 shown in FIG. 11.
Figure 13:
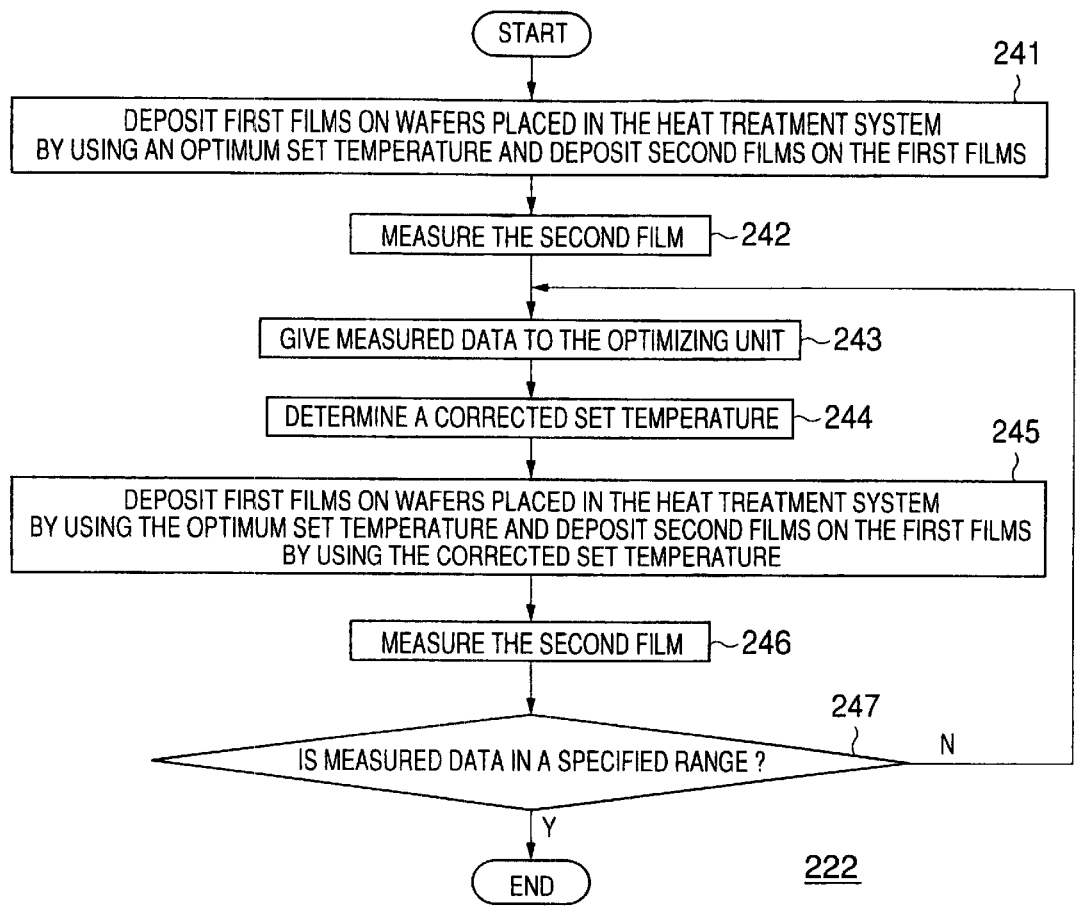
FIG. 13 is a flow chart of step 222 shown in FIG. 11.

A set temperature determining procedure different from that previously described in connection with FIGS. 2 to 4, for determining set temperatures for the heat treatment system shown in FIG. 1A will be described with reference to FIGS. 11 to 13. FIGS. 11 to 13 are flow charts of an optimum set temperature determining procedure for determining optimum set temperatures in a reaction tube corresponding to the outputs of a plurality of heaters for two films which are formed continuously. The two films are formed continuously in a two-layer film and the respective thicknesses of the two films can be individually measured. For example, one of the two films is an oxide film and the other is a nitride film formed on the oxide film.

Suppose that the thickness of a first film, i.e., a lower film, is required to be in a predetermined thickness range about a specific value, such as a range of 1.5 nm±1.0% and the thickness of a second film, i.e., an upper film is required to be in a predetermined thickness range about a specific value, such as a range of 2.5 nm±1.0%.

To meet such requirements, an optimum set temperature for depositing the first film, i.e., the lower film, is determined in step 221 shown in FIG. 11, and then an optimum set temperature for depositing the second film, i.e., the upper film, is determined in step 222.

Referring to FIG. 12, to determine an optimum first set temperature for depositing the first film, a plurality of test wafers are subjected continuously to a first and a second film deposition process in the heat treatment system shown in FIG. 1A instep 231. The plurality of wafers includes five wafers held in an upper zone, an upper middle zone, a middle zone, a lower middle zone and a lower zone of the wafer boat 13, respectively. The test wafers are unloaded from the heat treatment system after the completion of the first and the second film deposition process. The first and the second film deposition process use standard set temperatures for all the five test wafers.

The thickness of the first film formed on each of the unloaded test wafers is measured by a film thickness measuring instrument, such as an ellipsometer, in step 232. Data on the result of film deposition is given to the optimizing unit 39 shown in FIG. 1B in step 233. The optimizing unit 39 calculates and outputs a corrected set temperature in step 234.

A physical model representing the relationship between values of parameters including temperature, and film thickness, which grows, is stored beforehand in the optimizing unit 39. The optimizing unit 39 uses the model for the calculation. A corrected set temperature considered to be more appropriate can be derived from the data on the result of film deposition and the current set temperature by using the model, which is substantially similar to that previously described with reference to FIG. 3.

Then, other test wafers are subjected to the first and the second film deposition process using the corrected set temperature in the heat treatment system shown in FIG. 1A to deposit a first and a second film in step 235. The test wafers are unloaded from the heat treatment system after the completion of film deposition processes. The thickness of the first film deposited on each of the test wafers is measured by the film thickness measuring instrument, such as an ellipsometer, in step 236.

Measured thickness is compared with the predetermined thickness range, such as 1.5 nm±1.0%, in step 237. If the measured thickness is in this predetermined thickness range, the procedure for determining an optimum first set temperature for depositing the first film is completed. Thus, the corrected first set temperature (corrected set temperature trajectory) used for depositing the films is the optimum first set temperature (set temperature trajectory).

If the measured thickness does not fall in the predetermined thickness range, the procedure returns to step 233. Then, the result of film deposition (measured thickness) is given to the optimizing unit 39, and the optimizing unit 39 calculates another corrected set temperature. Thus, the optimum first set temperature (corrected first set temperature) suitable for depositing the first film having a quality meeting required qualities may be finally obtained.

Thus, the optimum first set temperature proper for depositing a first film meeting required specifications can be determined by depositing both the first film and the second film and measuring the thickness of the deposited first films.

Subsequently, an optimum second set temperature suitable for depositing the second film, i.e., the upper film, is determined. As shown in FIG. 13, first, first films are formed on a plurality of test wafers held in the heat treatment system by using the optimum first set temperature as determined above, and a second film depositing process continuous with the first film deposition process is carried out to deposit second films on the first films in step 241. The plurality of test wafers include five wafers held in an upper zone, an upper middle zone, a middle zone, a lower middle zone and a lower zone of the wafer boat 13, respectively. The second film deposition process uses a standard temperature for all the five test wafers. After the first film and the second film have been deposited in layers on each of the test wafers, the test wafers are unloaded form the heat treatment system.

The thickness of the second film formed on each of the unloaded test wafers is measured by a film thickness measuring instrument, such as an ellipsometer, in step 242. Data on the result of second film deposition is given to the optimizing unit 39 shown in FIG. 1B in step 243. The optimizing unit 39 calculates and outputs a corrected second set temperature in step 244.

A physical model representing the relationship between values of parameters including temperature, and film thickness, which grows, is stored beforehand in the optimizing unit 39. The optimizing unit 39 uses the model for the calculation. A corrected second set temperature considered to be more appropriate can be derived from the data on the result of film deposition and the current second set temperature, by using the model, which is substantially similar to the procedure for determining the optimum first set temperature.

Then, first and second films are deposited continuously on other test wafers using the corrected second set temperature (set temperature trajectory) for depositing the second films by the heat treatment system shown in FIG. 1A in step 245. The test wafers are unloaded from the heat treatment system after the first and the second film have been deposited on each of the test wafers.

The thickness of the second film deposited on each of the test wafers is measured by the film thickness measuring instrument, such as an ellipsometer, in step 246.

Measured thickness is compared with the predetermined thickness range, such as 2.5 nm±1.0%, in step 247. If the measured thickness is in this predetermined thickness range, the procedure for determining an optimum second set temperature for depositing the second film is completed. Thus, the corrected second set temperature (corrected set temperature trajectory) used for depositing the second films is the optimum second set temperature (set temperature trajectory).

If the measured thickness does not fall in the predetermined thickness range, the procedure returns to step 243. Then, the result of film deposition (measured thickness) is given to the optimizing unit 39, and the optimizing unit 39 calculates another corrected second set temperature. Thus, the optimum second set temperature (corrected set temperature) suitable for depositing the second film having a thickness falling in the predetermined thickness range may be finally obtained.

Thus, this embodiment achieves the determination of the optimum first set temperature and the optimum second set temperature proper for depositing the first film having a thickness (result of the first heat treatment) falling in the predetermined inter-wafer thickness dispersion range around the set value and for depositing the second film having a thickness (result of the second heat treatment) falling in the predetermined inter-wafer thickness dispersion range around the set value.

Thus, the optimum first set temperature for the preceding first film deposition process is determined first, and then the optimum second set temperature for the succeeding second film deposition process is determined. Therefore, the optimum first set temperature for the first film deposition process does not need any readjustment, and hence the optimum set temperatures for the interior of the reaction tube corresponding to the outputs of the plurality of heaters can be efficiently determined.

The first and the second set temperature may be dynamic set temperatures varying with time during the deposition of the corresponding films. The first and the second set temperature may vary during the deposition of the corresponding films in different modes of variation in different zones.

Figure 14:
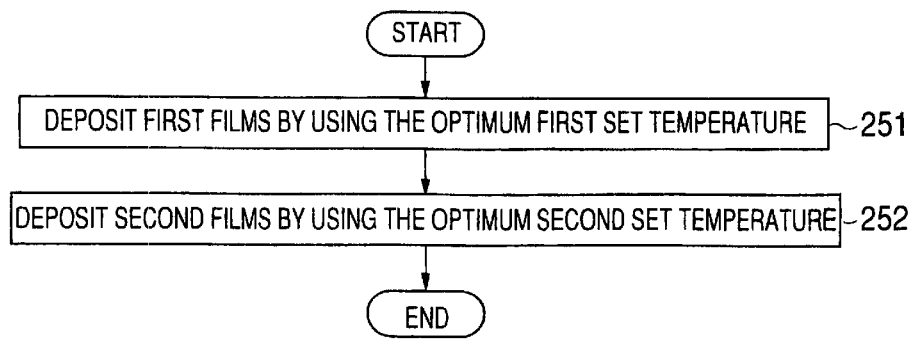
FIG. 14 is a flow chart of a procedure for continuously forming first and second films by the heat treatment system shown in FIG. 1A.

Incidentally, the heat treatment system shown in FIG. 1A is able to achieve a semiconductor device fabricating process capable of depositing films meeting the required thickness conditions by using the thus determined set temperatures. As shown in FIG. 14, the heat treatment system shown in FIG. 1A forms a first film by using the optimum first set temperature in step 251, and forms a second film by using the optimum second set temperature in step 252 continuously with the deposition of the first film. FIG. 14 is a flow chart showing a procedure for continuously forming films by the heat treatment system shown in FIG. 1A.

An example of the determination of the optimum set temperatures previously described with reference to FIGS. 5A to 6B will be concretely described in terms of a practical semiconductor device fabricating process. In this case, the semiconductor device fabricating process is a gate-oxide-film deposition process.

Generally, the gate-oxide-film forming process means a process that forms an oxide film on a semiconductor substrate by thermal oxidation. A gate electrode layer of polycrystalline silicon is formed on the oxide film (insulating film). For example, boron (B) is injected into the gate electrode layer of polycrystalline silicon to enhance the electric conductivity of the gate electrode layer. With the recent advancement of scale of integration and device miniaturization, the thickness of the gate-oxide-film has been progressively reduced. Therefore, it is possible that boron injected into the gate electrode is caused to diffuse into the gate oxide film or penetrate into the semiconductor substrate by a heat treatment process that is performed later unless some measures are taken. Such diffusion or penetration of boron may spoil necessary characteristics of the device.

It is known that a method that modifies the oxide film to form an oxynitride film is effective in preventing the diffusion or penetration of boron. A continuous heat treatment processes including a process for such modification will be described.

A first heat treatment process is a wet thermal oxidation process that is carried out in steam atmosphere. A second heat treatment process is an oxide film modifying process (oxynitriding process) that is carried out in NO atmosphere. Optimum set temperatures for respective zones in a wafer boat for the thermal oxidation process and those for the respective zones in the wafer boat for the oxide film modifying process are determined. The wafer boat is divided into four zones.

Description will be made of a comparative example wherein the thermal oxide film forming process and the oxide film modifying process are carried out continuously and a desired film thickness is 1.5 nm. Process conditions including gas pressures of gases, flow rates of gases and processing time, and excluding temperature are fixed. Proper set temperatures for the four zones of the wafer boat, i.e., upper, upper middle, lower middle and lower zones of the wafer boat, are determined by repeating the thickness measurement of films formed by the continuous processes and the correction of set temperatures.

Set temperatures determined for the four zones were 855° C., 855° C., 840° C. and 830° C., respectively. The mean thickness of the gate oxide films formed on the wafers held on the wafer boat by using those set temperatures was 1.559 nm, and the range of inter-wafer thickness dispersion (difference) was ±0.65%. The nitrogen contents of the films were in the range of 0.91 to 1.25% by atom (atoms %) (0.91% by atom for the films formed on the wafers in the upper zone of the wafer boat and 1.26% by atom for the films formed on the wafers in the lower zone of the wafer boat). The peak nitrogen content of the films was measured by SIMS (secondary ion-mass spectrography).

The comparative example for continuously carrying out the thermal oxide film forming process and the oxide film modifying process is capable of forming the films in a uniform thickness on the wafers held on the wafer boat, but the films have different nitrogen contents scattered in a wide range of about ±16%. Thus, the comparative example is unable to form homogeneous oxynitride films.

The result of application of the optimization previously described with reference to FIGS. 5A to 6B will be described hereinafter. First, the thermal oxidation process is optimized. The desired film thickness of a film formed by the thermal oxidation process is 1.65 nm, and process conditions including pressures of gases, flow rates of gases and processing time and excluding temperature are fixed. The thickness of a film thus formed is measured, and proper set temperatures for the four zones, i.e., the upper, the upper middle, the lower middle and the lower zone, of the wafer boat are determined by the aforesaid procedure.

Set temperatures for the four zones thus determined were 805° C., 801° C., 799° C. and 796° C., respectively. The mean thickness of thermal oxide films formed on the wafers held on the wafer boat was 1.667 nm, and the range of inter-wafer thickness dispersion (difference) was ±0.47%. Process conditions other than temperature were: flow rate of $H_2$: 0.4 slm, flow rate of $O_2$: 0.4 slm, flow rate of $N_2$: 30 slm, oxidation time: 40 s and process pressure: atmospheric pressure.

The thermal oxidation process using the predetermined set temperature is followed continuously by the oxide film modifying process, in which process conditions including pressures of gases, flow rates of gases and processing time and excluding temperature are fixed. The thickness of a modified film is measured, and proper set temperatures for the four zones of the wafer boat, i.e., the upper, the upper middle, the lower middle and the lower zone of the wafer boat, are determined by the procedure previously described. The desired thickness of the modified film was 1.8 nm, which was determined on an assumption that the oxide film modifying process is sufficiently effective in modifying the oxide film of 1.65 nm in thickness. In the oxide film modifying process, nitrogen contained in the NO gas used for modification is diffused into the oxide film and oxygen contained in the NO gas increases the thickness of the oxide film. Incidentally, process conditions other than temperature were: flow rate of NO: 1 slm, processing time: 3 min and process pressure: 1 kPa.

The set temperatures for the four zones of the wafer boat, i.e., the upper, the upper middle, the lower middle and the lower zone of the wafer boat, used in the oxide film modifying process were 848° C., 850° C., 851° C. and 852° C., respectively. The mean thickness of the modified oxide films formed on the wafers held on the wafer boat was 1.762 nm, and the range of inter-wafer thickness dispersion was ±0.64%. The nitrogen contents of the modified oxide films were in the range of 1.05 to 1.15% by atom (atoms %) (1.05% by atom for the films formed on wafers held in the upper zone of the wafer boat and 1.15% by atom for the films formed on wafers held in the lower zone of the wafer boat). The peak nitrogen content of the films was measured by SIMS.

This embodiment carries out the thermal oxide film forming process and the oxide film modifying process continuously and is capable of forming films on wafers held in the wafer boat in a uniform thickness. The range of scatter of nitrogen contents of the films is about ±4.5%, which is narrower than that of the films formed by the comparative example. That is, homogeneous oxynitride films can be formed on the wafers.

This example uses the measured thickness of the modified film as a measured result of the oxide film modifying process. The thickness of the modified film is dependent on both the thermal oxide film forming process (a first process) and the oxide film modifying process (a second process), and only the result of the second process is not measured for the optimization of the second process. That is, the thickness of the modified film, which is the result of both the first and the second process, is measured for the optimization of the second process. Consequently, the second process is managed properly, which is a feature of the present invention. FIG. 15 shows the embodiment and the comparative example comparatively. FIG. 15 is a table showing elements of a gate-oxide-film deposition process in an embodiment of the present invention and elements of a gate-oxide-film deposition process in a comparative example.

What is claimed is:

1. A method of determining set temperature trajectories for a heat treatment system that continuously conducts a first heat treatment process and a second heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the first heat treatment process and the second heat treatment process conducted to the second test object to be processed; and determining a second set temperature trajectory for the second heat treatment process by correcting the temporary second set temperature trajectory on the basis of the measured result of the first heat treatment process and the second heat treatment process.

2. A method according to claim 1, wherein
the first set temperature trajectory is fixed, and
the second set temperature trajectory is fixed.

3. A method according to claim 1, wherein
the first set temperature trajectory is variable, and
the second set temperature trajectory is variable.

4. A method according to claim 1, wherein
the heat treatment system is divided into a plurality of zones capable of being individually heated,
first set temperature trajectories are determined for the zones of the heat treatment system, respectively,
the first set temperature trajectories for the zones are different from each other,
second set temperature trajectories are determined for the zones of the heat treatment system, respectively, and
the second set temperature trajectories for the zones are different from each other.

5. A method according to claim 1, wherein
the first heat treatment process is a gate-oxide-film forming process by using thermal oxidation, and
the second heat treatment process is a nitriding process for nitriding the gate-oxide-film.

6. A method of determining set temperature trajectories for a heat treatment system that continuously conducts a first heat treatment process, a second heat treatment process and a third heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the first heat treatment process and the second heat treatment process conducted to the second test object to be processed;

determining a second set temperature trajectory for the second heat treatment process by correcting the temporary second set temperature trajectory on the basis of the measured result of the first heat treatment process and the second heat treatment process;

conducting the third heat treatment process to a third test object to be processed to which the first heat treatment process has been conducted by using the determined first set temperature trajectory and to which the second heat treatment process has been conducted by using the determined second set temperature trajectory, by using a temporary third set temperature trajectory;

measuring a result of the first heat treatment process, the second heat treatment process and the third heat treatment process conducted to the third test object to be processed; and determining a third set temperature trajectory for the third heat treatment process by correcting the temporary third set temperature trajectory on the basis of the measured result of the first heat treatment process, the second heat treatment process and the third heat treatment process.

7. A method according to claim 6, wherein
the first set temperature trajectory is fixed,
the second set temperature trajectory is fixed, and
the third set temperature trajectory is fixed.

8. A method according to claim 6, wherein
the first set temperature trajectory is variable,
the second set temperature trajectory is variable, and
the third set temperature trajectory is variable.

9. A method according to claim 6, wherein
the heat treatment system is divided into a plurality of zones capable of being individually heated,
first set temperature trajectories are determined for the zones of the heat treatment system, respectively,
the first set temperature trajectories for the zones are different from each other,
second set temperature trajectories are determined for the zones of the heat treatment system, respectively,
the second set temperature trajectories for the zones are different from each other,
third set temperature trajectories are determined for the zones of the heat treatment system, respectively, and
the third set temperature trajectories for the zones are different from each other.

10. A method of determining set temperature trajectories for a heat treatment system that continuously conducts a first heat treatment process and a second heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the second heat treatment process conducted to the second test object to be processed; and determining a second set temperature trajectory for the second heat treatment process by correcting the temporary second set temperature trajectory on the basis of the measured result of the second heat treatment process.

11. A method of continuously conducting a first heat treatment process and a second heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the first heat treatment process and the second heat treatment process conducted to the second test object to be processed;

determining a second set temperature trajectory for the second heat treatment process by correcting the temporary second set temperature trajectory on the basis of the measured result of the first heat treatment process and the second heat treatment process;

conducting the first heat treatment process to the object to be processed, by using the determined first set temperature trajectory; and conducting the second heat treatment process to the object to be processed to which the first heat treatment process has been conducted, by using the determined second set temperature trajectory.

12. A method according to claim 11, wherein
the first set temperature trajectory is fixed, and
the second set temperature trajectory is fixed.

13. A method according to claim 11, wherein
the first set temperature trajectory is variable, and
the second set temperature trajectory is variable.

14. A method according to claim 11, wherein
the heat treatment system is divided into a plurality of zones capable of being individually heated,
first set temperature trajectories are determined for the zones of the heat treatment system, respectively,
the first set temperature trajectories for the zones are different from each other,
second set temperature trajectories are determined for the zones of the heat treatment system, respectively, and
the second set temperature trajectories for the zones are different from each other.

15. A method according to claim 11, wherein
the first heat treatment process is a gate-oxide-film forming process by using thermal oxidation, and
the second heat treatment process is a nitriding process for nitriding the gate-oxide-film.

16. A method of continuously conducting a first heat treatment process, a second heat treatment process and a third heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the first heat treatment process and the second heat treatment process conducted to the second test object to be processed;

determining a second set temperature trajectory for the second heat treatment process by correcting the temporary second set temperature trajectory on the basis of the measured result of the first heat treatment process and the second heat treatment process;

conducting the third heat treatment process to a third test object to be processed to which the first heat treatment process has been conducted by using the determined first set temperature trajectory and to which the second heat treatment process has been conducted by using the determined second set temperature trajectory, by using a temporary third set temperature trajectory;

measuring a result of the first heat treatment process, the second heat treatment process and the third heat treatment process conducted to the third test object to be processed;

determining a third set temperature trajectory for the third heat treatment process by correcting the temporary third set temperature trajectory on the basis of the measured result of the first heat treatment process, the second heat treatment process and the third heat treatment process;

conducting the first heat treatment process to the object to be processed, by using the determined first set temperature trajectory;

conducting the second heat treatment process to the object to be processed to which the first heat treatment process has been conducted, by using the determined second set temperature trajectory; and conducting the third heat treatment process to the object to be processed to which the first heat treatment process and the second heat treatment process have been conducted, by using the determined third set temperature trajectory.

17. A method according to claim 16, wherein
the first set temperature trajectory is fixed, the second set temperature trajectory is fixed, and
the third set temperature trajectory is fixed.

18. A method according to claim 16, wherein
the first set temperature trajectory is variable,
the second set temperature trajectory is variable, and
the third set temperature trajectory is variable.

19. A method according to claim 16, wherein
the heat treatment system is divided into a plurality of zones capable of being individually heated,
first set temperature trajectories are determined for the zones of the heat treatment system, respectively,
the first set temperature trajectories for the zones are different from each other,
second set temperature trajectories are determined for the zones of the heat treatment system, respectively,
the second set temperature trajectories for the zones are different from each other,
third set temperature trajectories are determined for the zones of the heat treatment system, respectively, and
the third set temperature trajectories for the zones are different from each other.

20. A method of continuously conducting a first heat treatment process and a second heat treatment process to an object to be processed, said method comprising the steps of:

conducting the first heat treatment process to a first test object to be processed, by using a temporary first set temperature trajectory;

measuring a result of the first heat treatment process conducted to the first test object to be processed;

determining a first set temperature trajectory for the first heat treatment process by correcting the temporary first set temperature trajectory on the basis of the measured result of the first heat treatment process;

conducting the second heat treatment process to a second test object to be processed to which the first heat treatment process has been conducted by using the determined first set temperature trajectory, by using a temporary second set temperature trajectory;

measuring a result of the second heat treatment process conducted to the second test object to be processed;

determining a second set temperature trajectory for the second heat treatment process by correcting the temporary second set temperature trajectory on the basis of the measured result of the second heat treatment process;

conducting the first heat treatment process to the object to be processed, by using the determined first set temperature trajectory; and conducting the second heat treatment process to the object to be processed to which the first heat treatment process has been conducted, by using the determined second set temperature trajectory.

* * * * *